(12) United States Patent
Suzuki et al.

(10) Patent No.: US 7,677,901 B1
(45) Date of Patent: Mar. 16, 2010

(54) ELECTRIC CONNECTING APPARATUS FOR SEMICONDUCTOR DEVICES AND CONTACT USED THEREFOR

(75) Inventors: Katsumi Suzuki, Tokyo (JP); Takeyuki Suzuki, Yokohama (JP)

(73) Assignee: Yamaichi Electronics Co., Ltd., Tokyo (JP)

( * ) Notice: Subject to any disclaimer, the term of this patent is extended or adjusted under 35 U.S.C. 154(b) by 0 days.

(21) Appl. No.: 12/433,055

(22) Filed: Apr. 30, 2009

(30) Foreign Application Priority Data

Dec. 26, 2008 (JP) ............................. 2008-333948

(51) Int. Cl.
*H01R 12/00* (2006.01)

(52) U.S. Cl. ........................................................ 439/66

(58) Field of Classification Search .................. 439/66, 439/71, 840, 844
See application file for complete search history.

(56) References Cited

U.S. PATENT DOCUMENTS

| | | | |
|---|---|---|---|
| 5,388,998 A * | 2/1995 | Grange et al. ................. | 439/66 |
| 5,414,369 A | 5/1995 | Kazama | |
| 5,801,544 A | 9/1998 | Swart et al. | |
| 5,865,641 A | 2/1999 | Swart et al. | |
| 5,990,697 A | 11/1999 | Kazama | |
| 6,043,666 A | 3/2000 | Kazama | |
| 6,084,421 A | 7/2000 | Swart et al. | |
| 6,204,680 B1 | 3/2001 | Swart et al. | |
| 6,337,572 B1 | 1/2002 | Kazama | |
| 6,341,962 B1 | 1/2002 | Sinclair | |
| 6,396,293 B1 | 5/2002 | Vinther et al. | |
| 6,462,567 B1 | 10/2002 | Vinther et al. | |
| 6,506,082 B1 | 1/2003 | Meek et al. | |
| 6,642,728 B1 | 11/2003 | Kudo et al. | |
| 6,655,983 B1 | 12/2003 | Ishikawa et al. | |
| 6,746,252 B1 | 6/2004 | Scott | |
| 6,769,919 B2 | 8/2004 | Kosmala | |

(Continued)

FOREIGN PATENT DOCUMENTS

EP   1 096 613   6/2005

(Continued)

OTHER PUBLICATIONS

International Search Report dated Dec. 8, 2009 in corresponding International Patent Application No. PCT/JP2009/005785.

*Primary Examiner*—Phuong K Dinh
(74) *Attorney, Agent, or Firm*—Finnegan, Henderson, Farabow, Garrett & Dunner, LLP

(57) ABSTRACT

The contact includes the plunger and a coil spring unit for holding the plunger thereon. The plunger includes an upper contact strip having a plurality of contact points on an upper end portion thereof, a wide portion, and a lower contact strip having two contact strips each having a contact point at a lower end portion thereof. The coil spring unit includes a spring portion and a funnel shaped tight wound portion including a guiding portion and a slimly wound portion having a contact point at a lower end portion thereof. The plurality of contact points provided on the upper contact strip is arranged in a plane so as to be broadened at a distance. The contact points provided on the two contact strips of the lower contact strip are formed to be resiliently deformable with respect to each other.

8 Claims, 14 Drawing Sheets

U.S. PATENT DOCUMENTS

| | | | |
|---|---|---|---|
| 6,821,131 | B2 | 11/2004 | Suzuki et al. |
| 6,844,749 | B2 | 1/2005 | Sinclair |
| 6,900,651 | B1 | 5/2005 | Kazama |
| 6,937,045 | B2 | 8/2005 | Sinclair |
| 7,025,602 | B1 | 4/2006 | Hwang |
| 7,057,403 | B2 | 6/2006 | Kazama |
| 7,081,767 | B2 | 7/2006 | Kazama |
| 7,154,286 | B1 | 12/2006 | Marx et al. |
| 7,245,138 | B2 | 7/2007 | Jeong et al. |
| 7,256,593 | B2 | 8/2007 | Treibergs |
| 7,300,288 | B1 | 11/2007 | Chen |
| 7,404,717 | B2 | 7/2008 | Kazama |
| 7,459,922 | B2 | 12/2008 | Kazama |
| 7,467,952 | B2 * | 12/2008 | Hsiao et al. ............ 439/66 |
| 7,559,769 | B2 * | 7/2009 | Hsiao et al. ............ 439/66 |
| 2003/0006787 | A1 | 1/2003 | Kazama |
| 2004/0043641 | A1 * | 3/2004 | Kosmala ............... 439/66 |
| 2006/0073710 | A1 | 4/2006 | Hwang |
| 2006/0145719 | A1 | 7/2006 | Jeong et al. |
| 2006/0279301 | A1 | 12/2006 | Treibergs |
| 2007/0128906 | A1 | 6/2007 | Kazama et al. |
| 2008/0032529 | A1 | 2/2008 | Shimada |
| 2009/0009205 | A1 | 1/2009 | Kazama |

FOREIGN PATENT DOCUMENTS

| | | |
|---|---|---|
| EP | 1 607 749 | 5/2008 |
| JP | 5-10971 | 1/1993 |
| JP | 5-142254 | 6/1993 |
| JP | 5-256875 | 10/1993 |
| JP | 8-83661 | 3/1996 |
| JP | 9-121007 | 5/1997 |
| JP | 10-19926 | 1/1998 |
| JP | 10-19930 | 1/1998 |
| JP | 10-213592 | 8/1998 |
| JP | 10-239349 | 9/1998 |
| JP | 10-312845 | 11/1998 |
| JP | 11-3759 | 1/1999 |
| JP | 11-297444 | 10/1999 |
| JP | 2000-28638 | 1/2000 |
| JP | 2000-46867 | 2/2000 |
| JP | 2000-74994 | 3/2000 |
| JP | 2000-91391 | 3/2000 |
| JP | 2000-241447 | 9/2000 |
| JP | 2000-292437 | 10/2000 |
| JP | 2001-167831 | 6/2001 |
| JP | 2001-318107 | 11/2001 |
| JP | 2002-31648 | 1/2002 |
| JP | 2002-139513 | 5/2002 |
| JP | 2003-133023 | 5/2003 |
| JP | 2003-167001 | 6/2003 |
| JP | 2003-172748 | 6/2003 |
| JP | 2003-178848 | 6/2003 |
| JP | 2003-215160 | 7/2003 |
| JP | 2002-311083 | 10/2003 |
| JP | 2004-61180 | 2/2004 |
| JP | 2004-503750 | 2/2004 |
| JP | 2004-503783 | 2/2004 |
| JP | 2004-152495 | 5/2004 |
| JP | 2005-221309 | 8/2005 |
| JP | 2005-345443 | 12/2005 |
| JP | 2006-4932 | 1/2006 |
| JP | 2006-054083 | 2/2006 |
| JP | 2007-139711 | 6/2007 |
| JP | 2007-178196 | 7/2007 |
| JP | 2007-178403 | 7/2007 |
| JP | 2007-178404 | 7/2007 |
| JP | 2008-39456 | 2/2008 |
| JP | 2008-516398 | 5/2008 |
| WO | WO99/04274 | 1/1999 |
| WO | WO00/03251 | 1/2000 |
| WO | WO00/73805 | 12/2000 |
| WO | WO02/01232 | 1/2002 |
| WO | WO03/005042 | 1/2003 |
| WO | WO03/005044 | 1/2003 |
| WO | WO03/007435 | 1/2003 |

* cited by examiner

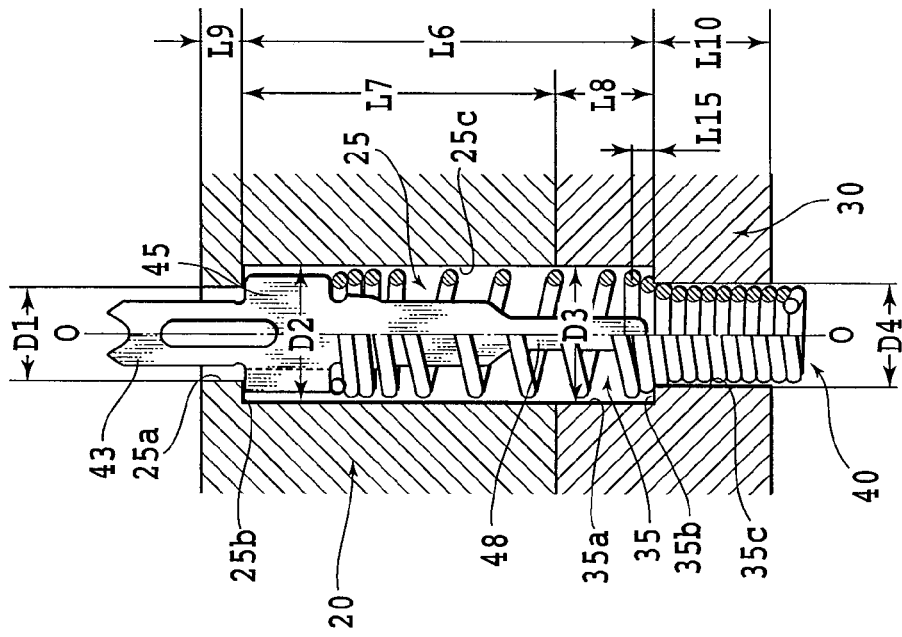
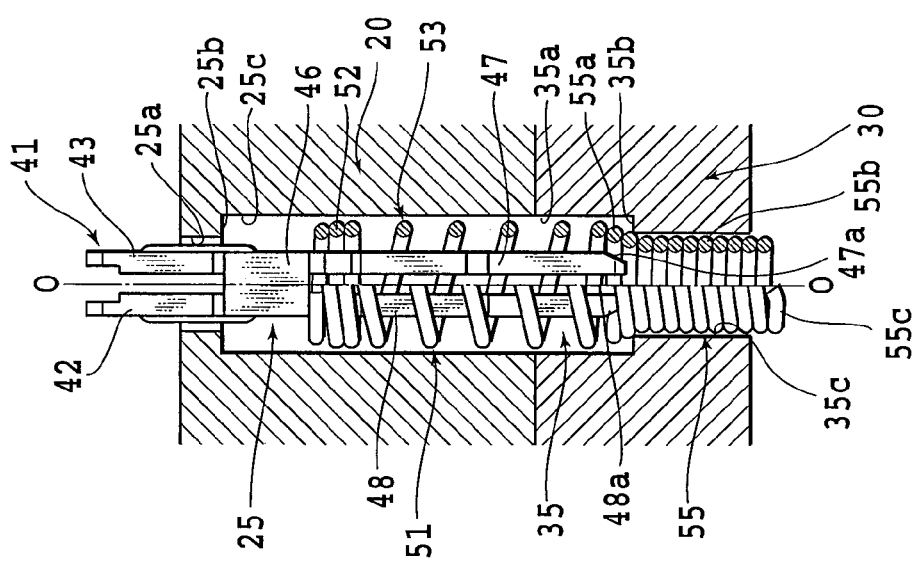

ELECTRIC CONNECTING APPARATUS FOR SEMICONDUCTOR DEVICES AND CONTACT USED THEREFOR

This application claims the benefit of Japanese Patent Application No. 2008-333948, filed Dec. 26, 2008, which is hereby incorporated by reference herein in its entirety.

BACKGROUND OF THE INVENTION

1. Field of the Invention

The present invention relates to an electric connecting apparatus for semiconductor devices configured to electrically connect semiconductor devices as a first contacted object, such as semiconductor wafer, bear chip, integrated circuit package, and liquid crystal display panel, with a wiring substrate as a second contacted object in order to conduct an inspection electrically, and a contact used therefor.

2. Description of the Related Art

In a process of manufacturing semiconductor devices such as semiconductor wafers, bear chips, integrated circuit packages (also referred to as "IC package"), and liquid crystal display panels (also referred to as "LCD panels"), various tests are conducted for inspecting the presence or absence of defectives in the semiconductor devices. As one of these tests, an inspection conducted by applying a test signal to the semiconductor devices as inspected objects and inspecting electric characteristics of the semiconductor devices is known. In general, such kind of test is conducted via an electric connecting apparatus (hereinafter, referred to simply as "IC socket") for semiconductor devices configured to electrically connect the inspected object and a wiring substrate such as a test board. As the IC socket as described above, an IC socket which is disclosed in Japanese Patent Laid-Open No. 2004-152495 is known.

In the IC socket which is disclosed in Japanese Patent Laid-Open No. 2004-152495, a contact including a plunger formed by punching a metal sheet into a predetermined shape via a press work and a coil spring resiliently urging the plunger is used. The plunger is placed in an though hole having a small-diameter portion and a large-diameter portion and being formed on an insulating base plate which constitutes a socket base of the IC socket so as to be able to move upward and downward therein. The plunger includes a terminal portion coming into contact with an external contact point of the semiconductor device (normally, formed as a solder ball) and is placed in the through hole in such a manner that the distal end of the terminal portion of the plunger projects upward from the through hole.

As disclosed in Japanese Patent Laid-Open No. 2004-152495, the plunger which constitutes the contact is formed simply by punching the sheet metal into the predetermined shape via the press work. Therefore, the plunger is shaped into a flat sheet, and does not have a structure to control transfer in the direction of thickness thereof. The terminal portion of the plunger which comes into contact with the semiconductor device as a contacted object is formed to come into contact with a corresponding external contact point of the semiconductor device at two points.

The plunger which constitutes the contact is configured as described above, is easily inclined with respect to the through hole formed on the insulating base plate which constitutes the IC socket, so that the positional accuracy of the terminal portion of the plunger is not stabilized. In other words, when the semiconductor device mounted on the IC socket and the contact come into contact with each other, the plunger of the contact is pressed in an inclined state, and the coil spring which supports the plunger is compressed. In this case, the contact position between the terminal portion of the plunger and the external contact point of the semiconductor device may be unstable due to the inclination of the plunger. Therefore, when the contact at a predetermined contact position is not achieved, a predetermined contact pressure might not be obtained between the terminal portion and the external contact point due to an insufficient amount of displacement of the contact. Accordingly, the result of inspection relating to the electric characteristics of the IC package, which should be essentially determined to be normal, might become "defective", so that the yield of the IC packages may be lowered.

Also, when the semiconductor device as the contacted object is an IC package of BGA (Ball Grid Array), the plunger is inclined with respect to the through hole, whereby an event such that the terminal portion of the plunger comes into contact with a side surface of a ball-shaped terminal (also referred to as "solder ball") as an external contact point of the IC package may occur. There is also a risk of formation of a contact mark on the side surface of the solder ball by the plunger due to the side surface contact of the plunger with respect to the solder ball. By the formation of the contact mark on the side surface of the solder ball by the plunger, the IC package, which should be essentially determined to be normal in an appearance inspection of the semiconductor device, is determined to be defective, so that the yield of the IC packages is lowered in this case as well.

Furthermore, when the solder balls of the IC package get the contact marks on a position which is not the predetermined position, specifically on top surfaces thereof, the respective solder balls may have different heights. Consequently, when mounting the IC package on an electronic apparatus, it might not be mounted correctly.

It is contemplated to prevent the inclination of the plunger by forming the through hole on the insulating base plate into a square shape in cross section, as disclosed in Japanese Patent Laid-Open No. 2004-152495. However, in recent years, the pitches between the plurality of external contact points formed on the semiconductor devices such as the IC packages tend to be finer, and hence it is very difficult to form the square-shaped through holes.

SUMMARY OF THE INVENTION

In view of such circumstances, it is an object of the invention to provide an electric connecting apparatus for semiconductor devices which is able to improve the positional accuracy of a terminal portion of a plunger which comes into contact with a semiconductor device as a contacted object and allow a stable contact with respect to the semiconductor device, and a contact used therefor.

In order to achieve the above described object, a contact used for an electric connecting apparatus for semiconductor devices according an aspect of the invention includes a plunger formed of a sheet metal and a coil spring unit formed of a metal wire for holding the plunger thereon, in which the plunger includes at least one upper contact strip having at least three contact points on an upper end portion thereof, a wide portion having a larger width than the width of the upper contact strip, and at least one lower contact strip having two contact strips of a smaller width than that of the wide portion, the two contact strips each having a contact point at a lower end portion thereof, the coil spring unit includes a spring portion which is resiliently deformable so as to be expandable and contractible in the vertical direction, and a tight wound portion of a funnel shape having a guiding portion and a slimly wound portion having a contact point at a lower end portion thereof and having an outer diameter and an inner diameter smaller than those of the spring portion, the at least three contact points provided on the at least one upper contact strip are arranged in a plane so as to be broadened at a distance, the two contact points provided on the two contact strips of the at least one lower contact strip are arranged at a distance so as to oppose to each other, are formed so as to be resiliently deformable with respect to each other, and have a distance therebetween to be smaller than the inner diameter of the spring portion and larger than the inner diameter of the slimly wound portion, and the spring portion of the coil spring unit is compressed when the plunger is pressed downward, and the two contact points of the lower contact strip come into resiliently contact with an inner peripheral surface of the slimly wound portion.

An electric connecting apparatus for semiconductor devices according to the invention is an electric connecting apparatus for semiconductor devices configured to electrically connect a semiconductor device as a first contacted object and a second contacted object, the apparatus comprising: a first base member having a placing recess in which the semiconductor device is placed and a plurality of first through holes; a second base member having a housing recess for housing the first base member and a plurality of second through holes formed corresponding respectively to the plurality of first through holes; and a plurality of the contacts being held in a plurality of contact housing spaces defined by the first through holes and the second through holes in a compressed state, respectively, in which the first through holes each have a small-diameter portion, a shoulder portion, and a large-diameter portion, the second through holes each have a large-diameter portion, a shoulder portion, and a small-diameter portion, the contacts are held in the contact housing spaces by the abutment of the wide portions of the plungers of the contacts against the shoulder portions of the first through holes and the abutment of the guiding portions of the coil spring units of the contacts against the shoulder portions of the second through holes; and the contact points provided on the upper contact strips of the plungers of the contacts come into contact with external contact points of the first contacted object, and the contact points provided on the slimly wound portions of the coil spring units of the contacts come into contact with external contact points of the second contacted object.

The contact according to the invention includes the two resiliently deformable contact strips provided on the lower contact strip of the plunger, so that the two contact strips reliably come into contact with the inner peripheral surface of the slimly wound portion of the coil sprint unit when the plunger is pressed downward. Therefore, when such contacts are built in the electric connecting apparatus, an electrically short-circuited path is formed on the each contact, so that the resistance of the path may be reduced, and a high-speed signal transmission is achieved, whereby a reliable electric connecting apparatus is provided.

Since the at lest three contact points are arranged on the upper end of the upper contact strip of the plunger in a plane so as to be broadened at a distance, the at least three contact points are electrically connected to the external contact point of the semiconductor device as the first contacted object reliably. Furthermore, since the upper contact strip is configured to have the at least three contact points on the upper end thereof in a plane so as to be broadened at a distance, the inclination of the contact is restrained when the contact is built in the electric connecting apparatus. Accordingly, the positional accuracy of the at least three contact points of the upper contact strip is improved, the contact with the external contact points of the first contacted object into contact with which the at least three contact points come is ensured, and damage of the external contact points is avoided.

Furthermore, since the plunger which constitutes the contact may be formed only by punching a sheet metal and bending the same, the manufacture thereof is easy and hence the manufacturing costs of the electric connecting apparatus can be kept down.

The above and other objects, effects, features and advantages of the present invention will become more apparent from the following description of embodiments thereof in conjunction with the accompanying drawings.

Further features of the present invention will become apparent from the following description of exemplary embodiments (with reference to the attached drawings).

BRIEF DESCRIPTION OF THE DRAWINGS

FIG. 5 is a schematic cross-sectional view of an IC socket according to the invention in which the contact shown in FIG. 1 is built in;

FIG. 6A is a partially enlarged cross-sectional view of the IC socket shown in FIG. 5;

FIG. 6B is a partially enlarged cross-sectional view of the IC socket shown in FIG. 5 viewed in the direction orthogonal to the FIG. 6A;

DESCRIPTION OF THE EMBODIMENTS

Figure 1:
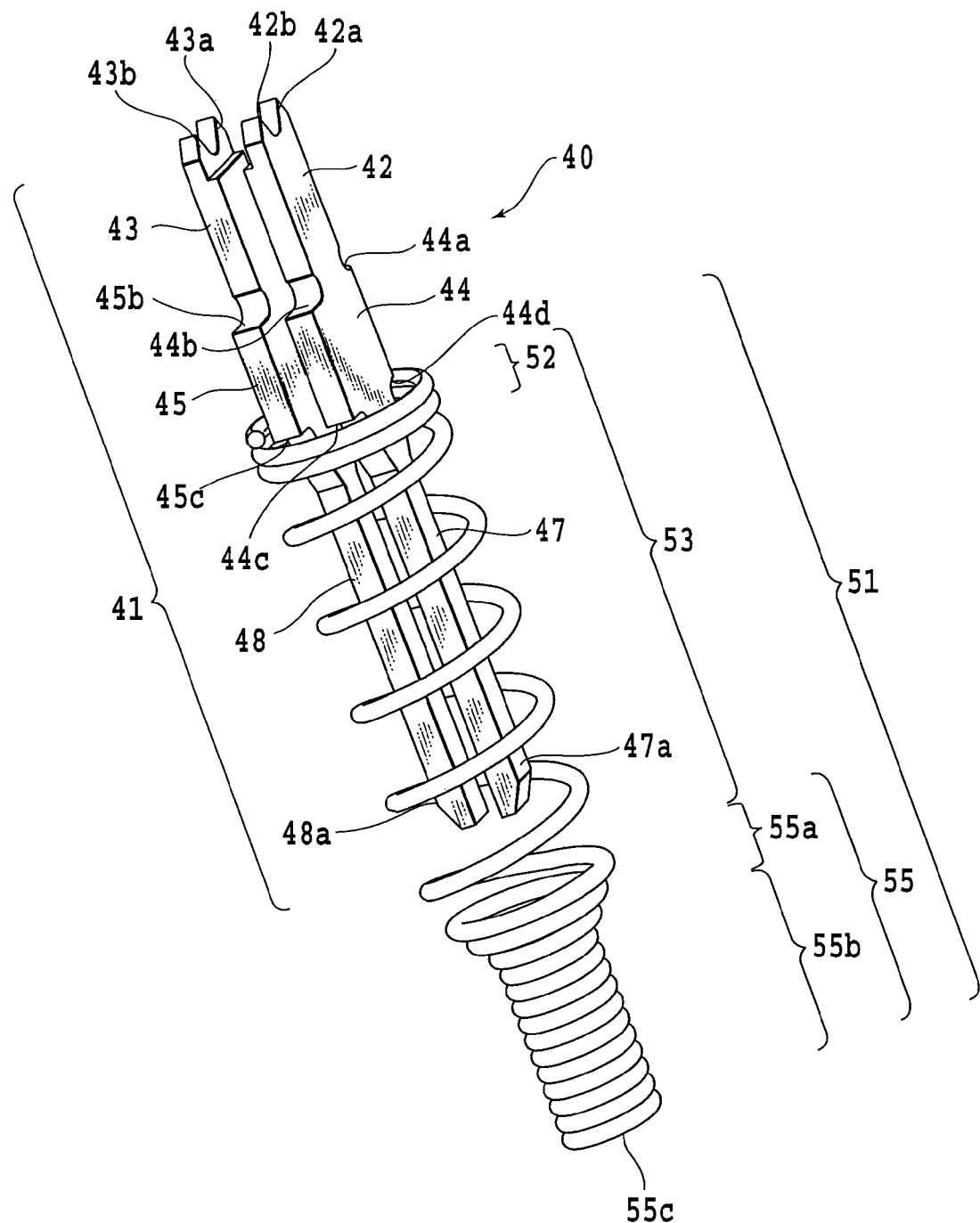
FIG. 1 is a perspective view of a contact according to an embodiment of the invention.

Referring now to the drawings, some preferred embodiments of an electric connecting apparatus for semiconductor device (IC socket) according to the invention, and a contact used therefore will be described.

First Embodiment

Figure 5:
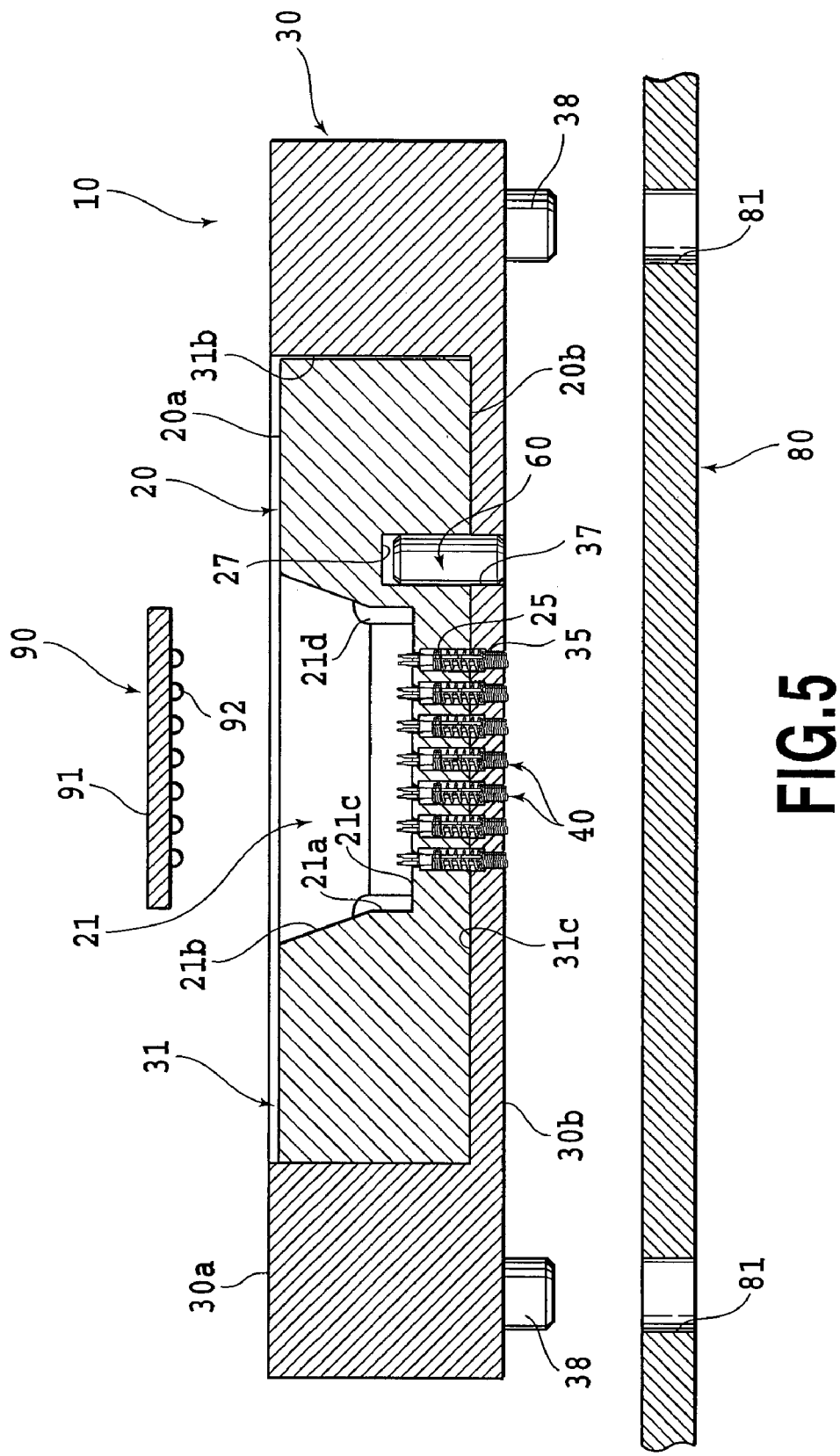

First of all, a first embodiment of an IC socket according to the invention will be described. FIG. 5 shows a schematic drawing of an IC socket according to the invention.

As shown in FIG. 5, an IC socket 10 in the invention schematically includes a first base member 20, a second base member 30, and a plurality of contacts 40. Reference numeral 80 designates a second contacted object which comes into contact with the contacts 40 of the IC socket 10, which is a wiring substrate such as a test board on which the IC socket 10 is attached. Reference numeral 90 designates a first contacted object which comes into contact with the contacts 40 of the IC socket 10, which is an IC package to be mounted on the IC socket 10. The IC package 90 as the first contacted object is electrically connected to the wiring substrate 80 as the second contacted object via the IC socket 10. In this embodiment, the IC package 90 as the first contacted object includes a mold body 91 and a plurality of solder balls 92 arranged as external contact points in a matrix pattern.

The first base member 20 is formed of electrically insulative synthetic resin material and has a substantially parallelepiped shape, and is housed in the housing recess 31 formed in the second base member 30. Preferably, but not limited thereto, an upper surface 20a of the first base member 20 is flush with an upper surface 30a of the second base member 30 when being assembled as the IC socket 10 and housed in the housing recess 31.

The first base member 20 is formed with a placing recess 21 opening upward at a center portion of the upper surface 20a, and the IC package 90 is placed and held in the placing recess 21. The placing recess 21 has a horizontal cross-section which is similar to a horizontal cross-sectional shape (normally, rectangular shape) of the IC package 90 placed therein. The placing recess 21 has four side surfaces 21a, 21b and a bottom surface 21c. The four side surfaces of the placing recess 21 each include an inclined surface 21b and a vertical surface 21a. More specifically, upper portions of the side surfaces are formed as the inclined surfaces 21b so as to make the placing recess 21 widened upward to allow easy guiding when placing the IC package 90 therein, and lower portions of the placing recess 21 are formed as the vertical surfaces 21a. Reference numeral 21d designates runout portions formed at lower portions of the placing recess 21 where adjacent side surfaces intersect. Four such the run-out portions 21d are formed in total to allow four corners of the IC package 90 corresponding thereto to be arranged therein.

A plurality of first through holes 25 are formed through the first base member 20 between a lower surface 20b of the first base member 20 and the bottom surface 21c of the placing recess 21 corresponding to the plurality of solder balls 92 provided on the IC package 90 mounted. The first through holes 25 define contact housing spaces for placing the contacts 40 therein, described later, in cooperation with second through holes 35 provided on the second base member 30, described later. The plurality of first through holes 25 are arranged in a matrix pattern in the same manner as the arrangement of the plurality of solder balls 92 of the IC package 90.

The first through holes 25 each include a cylindrical small-diameter portion 25a, a shoulder portion 25b, and a cylindrical large-diameter portion 25c from the top as shown in FIG. 6A. The small-diameter portion 25a houses two upper contact strips 42 and 43 of a plunger 41 which constitutes the contact 40. Therefore, the small-diameter portion 25a has a diameter D1 which is slightly larger than a width W1 of the respective upper contact strips 42 and 43 or a distance W5 between the upper contact strips 42 and 43. A length L9 of the small-diameter portion 25a is set to be shorter than the length L9 of the upper contact strips 42 and 43 of the plunger 41 which constitutes the contact 40. The large-diameter portion 25c houses two wide portions 44 and 45 of the plunger 41 which constitutes the contact 40, and a spring portion 53 of a coil spring unit 51 which constitutes the contact 40. Therefore, the large-diameter portion 25c has a diameter D2 which is slightly larger than a width W2 of the respective wide portions 44 and 45 and an outer diameter D5 of the coil spring unit 51.

Formed between the small-diameter portion 25a and the large-diameter portion 25c is the shoulder portion 25b, and hence the small-diameter portion 25a and the large-diameter portion 25c are continued in a stepped shape via the shoulder portion 25b. The shoulder portion 25b is flat, and extends in a plane orthogonal to the center line O-O of the through hole 25, that is, a plane parallel to the lower surface 20b of the first base member 20 and the bottom surface 21c of the placing recess 21. As shown in FIG. 5, the shoulder portion 25b comes into abutment with the wide portions 44 and 45 of the plunger 41 of the contact 40 when being assembled as the IC socket 10, and holds the contact 40 within the contact housing space in a state of slightly compressing the contact 40.

Reference numeral 27 designates positioning holes opening downward for housing parts of positioning pins 60, and a plurality of the positioning holes 27 are formed at adequate positions. The positioning holes 27 each have a center axis which is identical to the center axis of the corresponding positioning hole 37 formed on the second base member 30, and has substantially the same diameter as the positioning hole 37. The positioning hole 27 and the positioning hole 37 are not limited to have the substantially same diameter, and may have different diameters.

The second base member 30 is formed of electrically insulative synthetic resin material like the first base member 20, and is formed substantially into a parallelepiped shape. The second base member 30 is formed with the housing recess 31 of a parallelepiped shape opening upward and including four side surfaces 31b and a bottom surface 31c at a center portion of the upper surface 30a. The first base member 20 is placed in the housing recess 31 as described above, and is fixed on the second base member 30 using a fixing member such as a bolt. The height of the side surface 31b of the housing recess 31 is almost the same height as the first base member 20, and the size (surface area) of the bottom surface 31c is almost the same as the size (bottom surface area) of the first base member 20.

The plurality of second through holes 35 are formed through the second base member 30 between a lower surface 30b of the second base member 30 and the bottom surface 31c of the housing recess 31 corresponding to the plurality of first through holes 25 provided on the first base member 20. The second through holes 35 define contact housing spaces for housing the contacts 40 in cooperation with the first through holes 25 provided on the first base member 20. Therefore, the second through holes 35 have the same center lines as the corresponding first through holes 25 and the plurality of second through holes 35 are arranged in a matrix pattern.

As shown in FIG. 6A, the second through holes 35 each have a cylindrical large-diameter portion 35a, a shoulder portion 35b, and a cylindrical small-diameter portion 35c from the top. The large-diameter portion 35a has the diameter D3 which is substantially the same as the diameter D2 of the large-diameter portion 25c of the corresponding first through hole 25, and substantially houses a lower portion of the spring portion 53 of the coil spring unit 51 which constitutes the contact 40, and a guiding portion 55a of a tight wound portion 55. The large diameter portion 35a and the large-diameter portion 25c do not necessarily have to have substantially the same diameter, and may have different diameters. The small-diameter portion 35c houses a slimly wound portion 55b of the coil spring unit 51 which constitutes the contact 40. Therefore, the small-diameter portion 35c has a diameter D4 which is slightly larger than an outer diameter D6 of the slimly wound portion 55b, and a length L10 thereof is set to be shorter than the length of the slimly wound portion 55b (a length L5 of the tight wound portion 55—the length of the guiding portion 55a). Formed between the large-diameter portion 35a and the small-diameter portion 35c is the shoulder portion 35b, and hence the large-diameter portion 35a and the small-diameter portion 35c are continued in a stepped shape via the shoulder portion 35b. The shoulder portion 35b of the second through hole 35 is flat as the shoulder portion 25b of the first through hole 25, and extends in a plane orthogonal to the centerline O-O of the second through hole 35, that is, in a plane extending in parallel to the lower surface 30b of the second base member 30 and the bottom surface 31c of the housing recess 31. The shoulder portion 35b of the second through hole 35 comes into abutment with the guiding portion 55a of the tight wound portion 55 of the coil spring unit 51 which constitutes the contact 40 when being assembled as the IC socket 10 as shown in FIG. 5, and holds the contact 40 in the contact housing space.

Reference numeral 37 designates positioning holes configured to house parts of the positioning pins 60 which penetrate through the lower surface 30b of the second base member 30 and the bottom surface 31c of the housing recess 31, and a plurality of the positioning holes 37 are formed corresponding to the positioning holes provided on the first base member 20. Therefore, as described above, the positioning holes 37 each have a center axis which is identical to the center axis of the corresponding positioning hole 27 formed on the first base member 20, and have substantially the same diameter as the positioning hole 27. Reference numeral 38 designates positioning pins inserted into through holes 81 provided on the wiring substrate 80 for positioning the IC socket 10 on the wiring substrate 80, and which are provided at adequate positions so as to project from the lower surface 30b of the second base member 30 downward.

Although not shown, the second base member 30 is provided with a cover member including a pushing member which presses down the IC package 90 placed in the placing recess 21 of the first base member 20 against the contacts 40. The second base member 30 may be provided with a holding member configured to hold the cover member or an attaching member configured to fix the IC socket 10 on the wiring substrate 80.

Figure 2A:
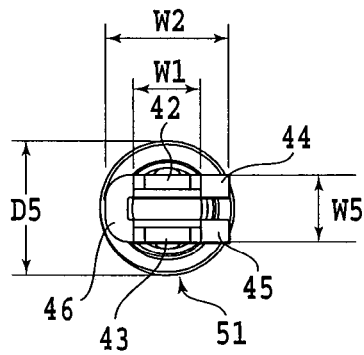
FIG. 2A is a top view of the contact shown in FIG. 1.
Figure 2C:
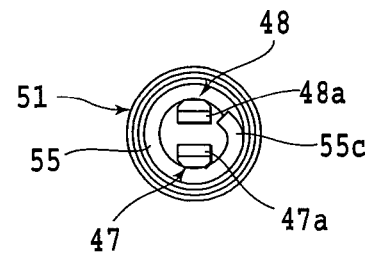
FIG. 2C is a bottom view of the contact shown in FIG. 1.
Figure 2B:
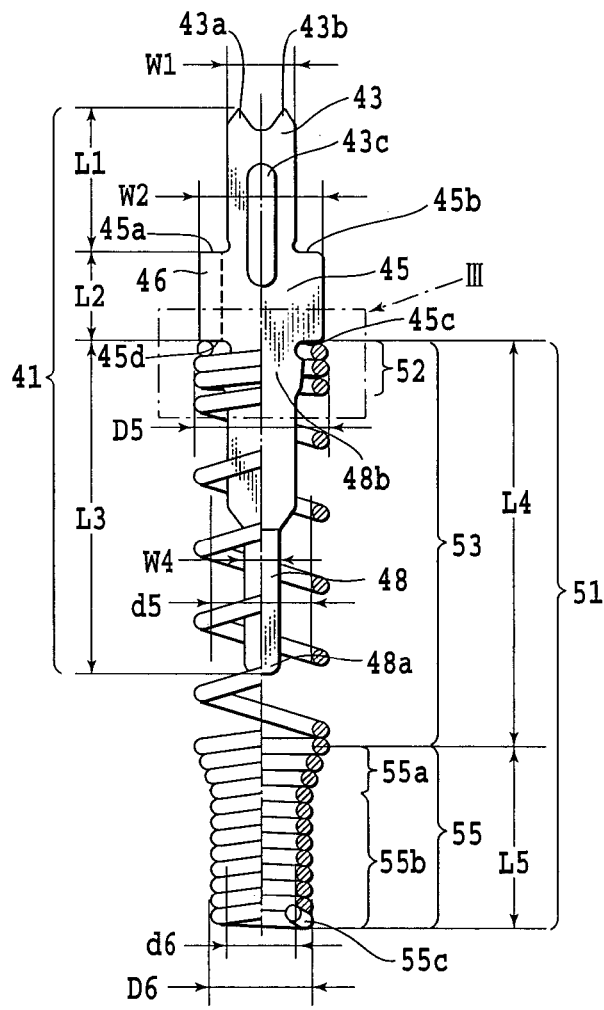
FIG. 2B is a front view of the contact shown in FIG. 1.
Figure 2D:
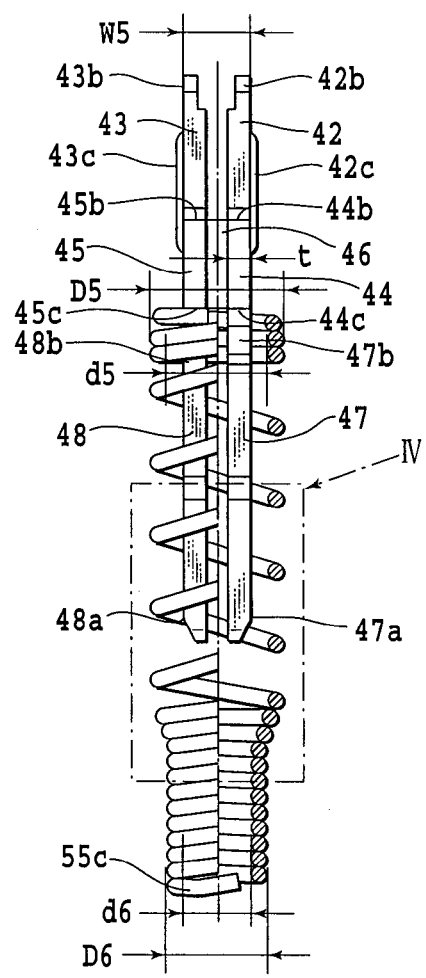
FIG. 2D is a side view of the contact shown in FIG. 1.
Figure 3:
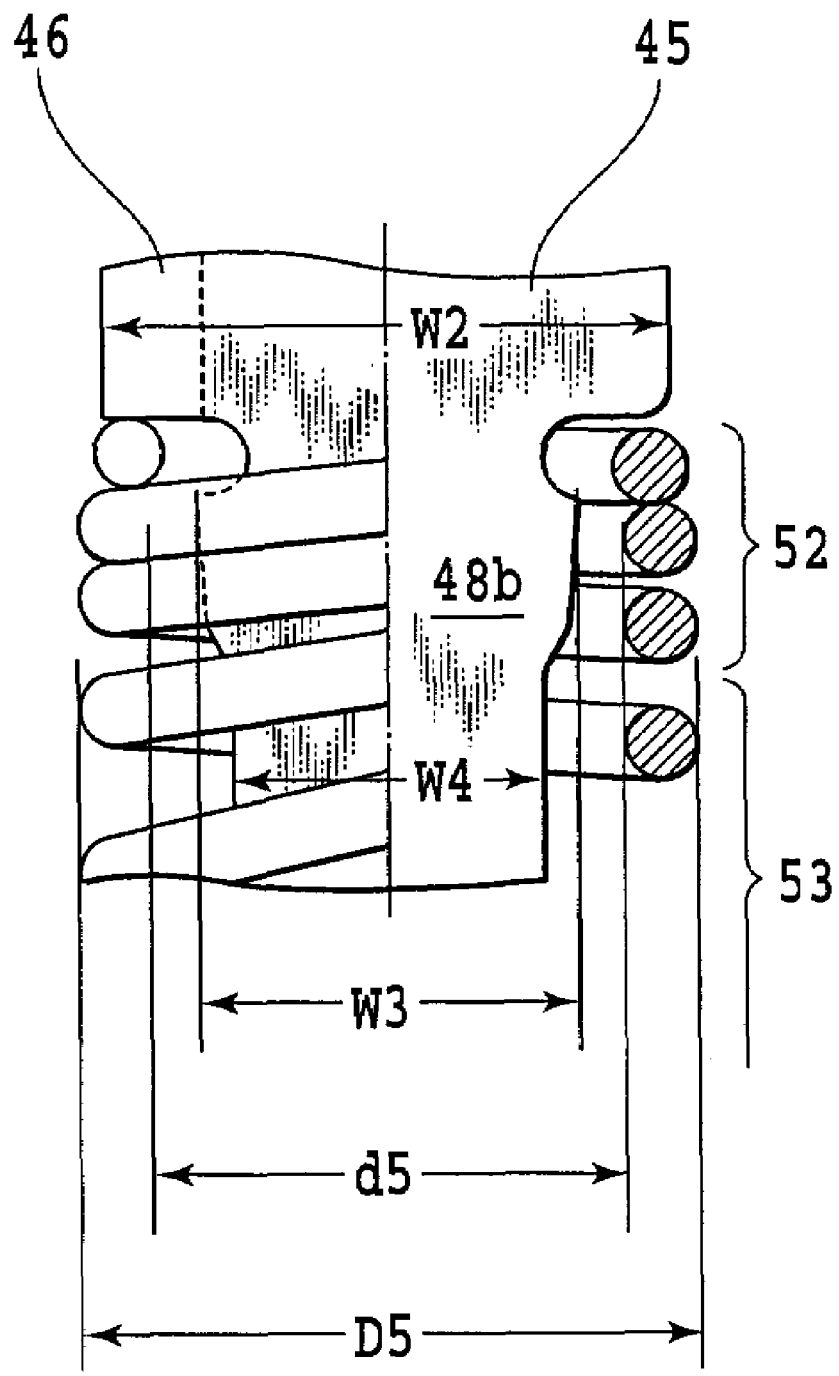
FIG. 3 is a partial enlarged view of a portion surrounded by a dot line III in FIG. 2B.
Figure 9A:
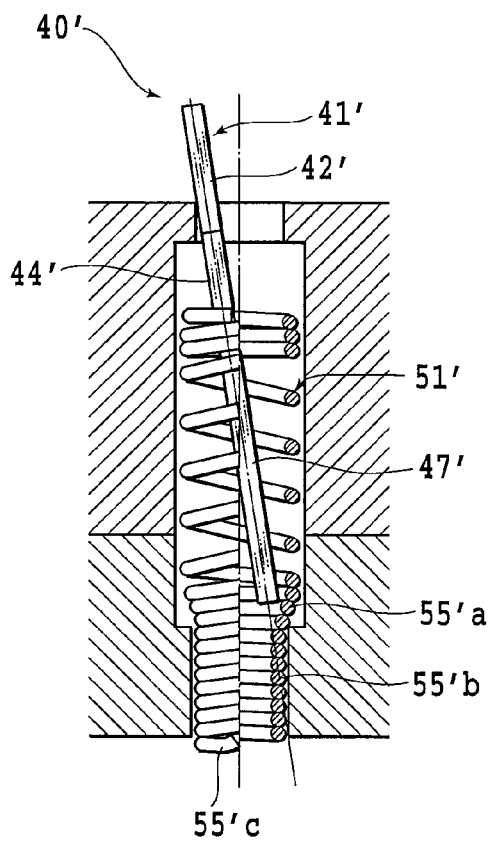
FIG. 9A is an explanatory drawing showing the inclinations of the contact in the embodiment of the invention and the conventional contact, and is a partially enlarged cross-sectional view of the contact in the related art equivalent to FIG. 6A.
Figure 9B:
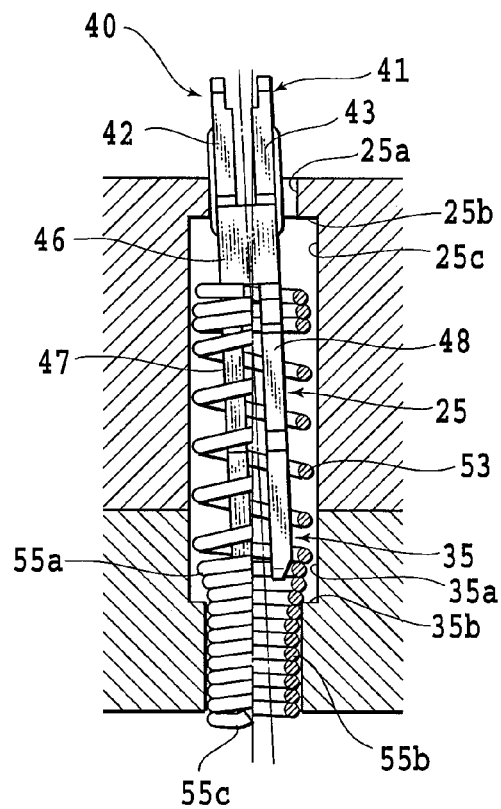
FIG. 9B is an explanatory drawing showing the inclinations of the contact in the embodiment of the invention and the conventional contact, and is a partially enlarged cross-sectional view of the contact in the embodiment of the invention equivalent to FIG. 6A.
Figure 10A:
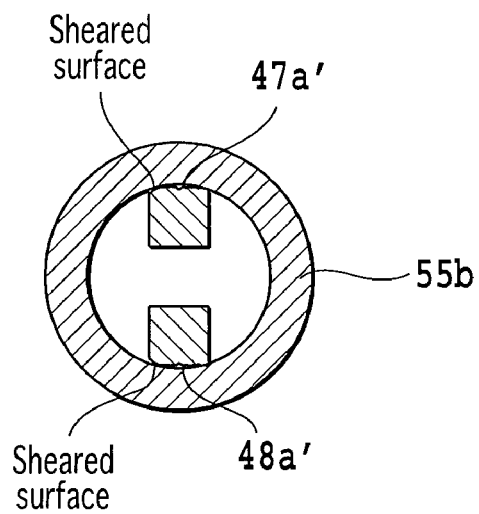
FIG. 10A is a drawing for explaining the contacts between a lower contact strip and the coil spring unit in the contact of the invention and in the conventional contact, and is a partially enlarged cross-sectional view of the conventional contact equivalent to FIG. 10B.
Figure 10B:
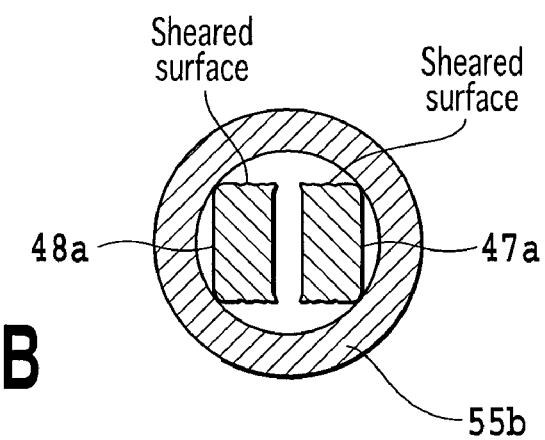
FIG. 10B is a drawing for explaining the contacts between the lower contact strip and the coil spring unit in the contact of the invention and in the conventional contact, and is a partially enlarged cross-sectional view of the contact in the embodiment of the invention taken along the line X-X in FIG. 8A.
Figure 10C:
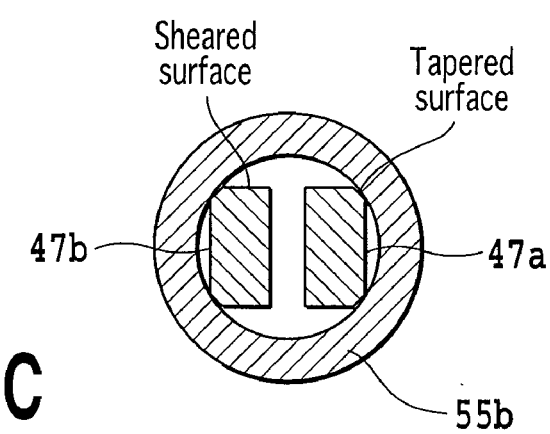
FIG. 10C is a drawing for explaining the contacts between the lower contact strip and the coil spring unit in the contact of the invention and in the conventional contact, and is a partially enlarged cross-sectional view of a modification of the contact in the embodiment of the invention equivalent to FIG. 10B.
Figure 11A:
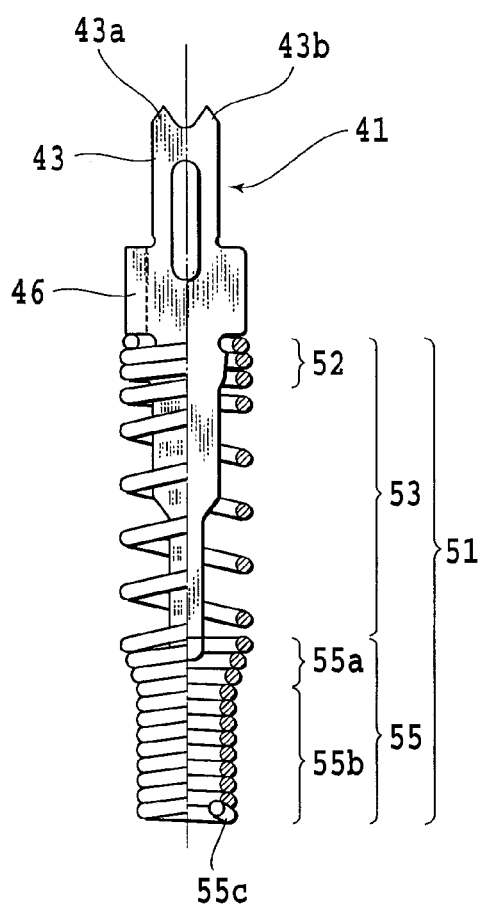
FIG. 11A is a side view of a modification of the contact shown in FIG. 1.
Figure 11B:
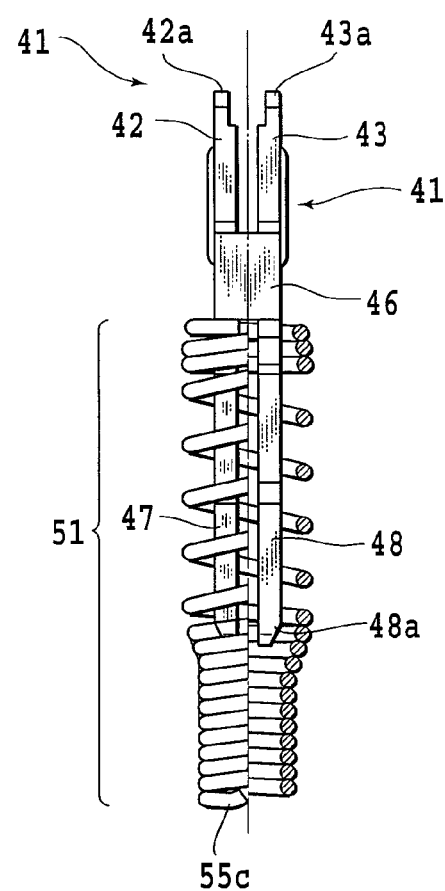
FIG. 11B is a front view of the modification of the contact shown in FIG. 1.

Referring now to FIG. 1 to FIG. 11B, an example of contact 40 as a principal portion of the invention will be described. FIG. 1 is a perspective view of an example of the contact according to the invention, FIGS. 2A, 2B, 2C, and 2D are detailed drawings of FIG. 1, and are respectively a top view, a front view, a bottom view, and a side view. FIG. 3 is a partial enlarged drawing of a portion surrounded by a dot line III in FIG. 2B. FIGS. 4A, 4B, and 4C are drawings for explaining that the contact is able to correct the position by itself, and are respectively a partially enlarged drawing of a portion surrounded by a dot line IV in FIG. 2D showing that the contact is in a free state, a partially enlarged drawing of a portion equivalent to FIG. 2A showing that the contact is in the course of being pressed downward, and a partial enlarged drawing of a portion equivalent to FIG. 2A showing that the contact has rectified in position, and is pressed correctly downward. FIG. 5 is a schematic cross-sectional view of the IC socket according to the embodiment of the invention in which the contact shown in FIG. 1 is built in. FIGS. 6A and 6B are partially enlarged cross-sectional views of the IC socket shown in FIG. 5, and are respectively a cross-sectional view equivalent to FIG. 5 and a cross-sectional view viewed in the direction orthogonal to FIG. 6A. FIGS. 7A and 7B are partially enlarged cross-sectional views of the IC socket in the state in which the IC socket is mounted on the wiring substrate, and are respectively a cross-sectional view equivalent to FIG. 6A, and a cross-sectional view equivalent to FIG. 6B. FIGS. 8A and 8B are partially enlarged cross-sectional views of the IC socket in which the IC package is added from the states in FIGS. 7A and 7B, and are respectively a cross-sectional view equivalent to FIG. 6A, and a cross-sectional view equivalent to FIG. 6B. FIGS. 9A and 9B are drawings for explaining the inclinations of the contact in the embodiment of the invention and the conventional contact, and are respectively a partially enlarged cross-sectional view of the conventional contact equivalent to FIG. 6A, and a partially enlarged cross-sectional view of the contact in the embodiment of the invention equivalent to FIG. 6A. FIGS. 10A, 10B, and 10C are drawings for explaining the contacts between the lower contact strip and the coil spring unit in the contact in the embodiment of the invention and in the conventional contact, and are respectively a partially enlarged cross-sectional view of the conventional contact equivalent to FIG. 10, a partially enlarged cross-sectional view of the contact in the embodiment of the invention taken along the line X-X in FIG. 8A, and a partially enlarged cross-sectional view of a modification of the contact in the invention equivalent to FIG. 10B. FIGS. 11A and 11B are drawings showing a modification of the contact shown in FIG. 1, and are respectively a side view and a front view.

As shown in FIG. 1, the contact 40 includes a plunger 41 and the coil spring unit 51. When the contacts 40 are assembled as the IC socket 10 as shown in FIG. 5, most parts of the contacts 40 are placed in the contact housing spaces.

The plunger 41 in the embodiment includes a first portion having the upper contact strip 42, the wide portion 44, and a lower contact strip 47 from the top, a second portion having the upper contact strip 43, the wide portion 45, and a lower contact strip 48 from the top, and a connecting portion 46 for connecting the first portion and the second portion. The connecting portion 46 has a length L2 which is substantially the same as the wide portions 44 and 45 and connects therebetween. The two upper contact strips 42 and 43 which constitute the plunger 41 have a same length L1 and the same width W1, and the two wide portions 44 and 45 have the same length L2 and the same width W2, and the lower contact strips 47 and 48 have a same length L3 and a same width W4.

The first portion and the second portion of the plunger 41 are arranged in lateral symmetry with respect to the connecting portion 46 in the deployed state. The plunger 41 is formed by punching a sheet metal of, for example, copper alloy having a thickness of t via the press work. As shown in FIGS. 2A to 2D, the plunger 41 is formed by bending the punched member into a substantially angular C-shape with the connecting portion 46 as a bottom side, and arranging the first portion and the second portion at the distance W5. In other words, the first portion and the second portion are arranged in parallel to each other so as to face each other.

In this embodiment, the two upper contact strips 42 and 43 which constitute the plunger 41 are partly arranged in the small-diameter portion 25a of the first through hole 25, and the upper portions thereof project upward from the small-diameter portion 25a as described above. Therefore, the length L1 of the two upper contact strips 42 and 43 which constitute the plunger 41 is set to be longer than the length L9 of the small-diameter portion 25a of the first through hole 25. The two upper contact strips 42 and 43 respectively have two contact points 42a, 42b and 43a, 43b on the left and right in FIG. 2B, and hence the contact 40 includes four contact points. The contact points 42a, 42b and 43a, 43b formed on upper ends of the two upper contact strips 42 and 43 come into contact with corresponding one solder ball 92 of the IC package 90 placed in the placing recess 21. As is understood from FIG. 2A, the contact points 42a, 42b and 43a, 43b are not arranged linearly as in the related art, and are arranged so as to be broadened in the front, rear, left, and right. Therefore, in this embodiment, the contact points 42a, 42b and 43a, 43b come into contact with the solder ball 92 so as to surround the spherical surface of the solder ball 92. The two upper contact strips 42 and 43 which constitute the plunger 41 may be provided respectively with projecting ridges 42c and 43c projecting outward (leftward and rightward in FIG. 2D) for reinforcement.

Figure 8A:
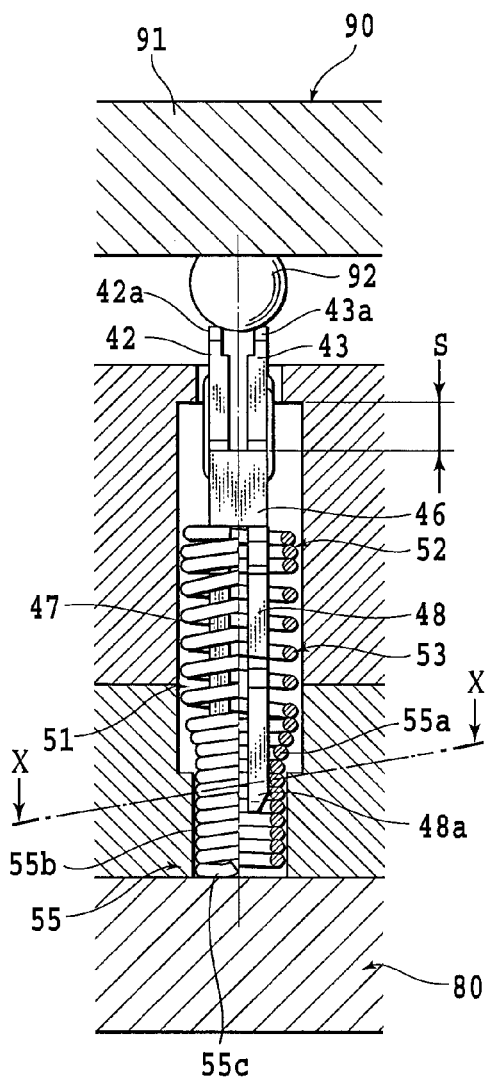
FIG. 8A is a partially enlarged cross-sectional view of the IC socket in a state in which an IC package is mounted further from the state shown in FIG. 7A equivalent to FIG. 6A.
Figure 8B:
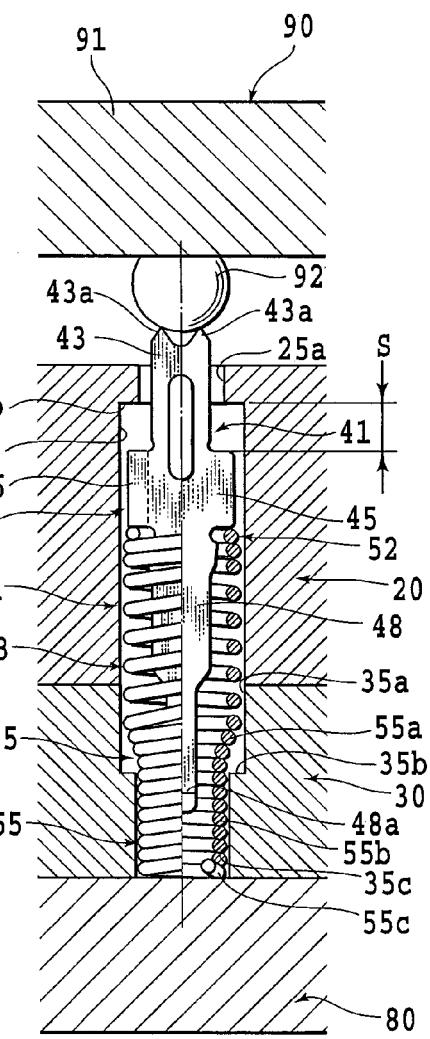
FIG. 8B is a partially enlarged cross-sectional view of the IC socket in a state in which the IC package is mounted further from the state shown in FIG. 7B equivalent to FIG. 6B.

As shown in FIGS. 8A and 8B, in this embodiment, since the four contact points 42a, 42b and 43a, 43b come into contact with the solder ball 92 having a spherical surface, the electric connection is further ensured. As shown in FIG. 9B, since the two upper contact strips 42 and 43 of the plunger 41 are arranged at a distance, the amount of freedom of the upper contact strips 42 and 43 in the small-diameter portion 25a of the first through holes 25 is lessen. Therefore, the plunger 41 in this embodiment is restrained from inclining in the direction of thickness thereof as in the related art shown in FIG. 9A, whereby instability of the contact with respect to the solder ball is prevented. Furthermore, in a conventional contact 40' shown in FIG. 9A, an upper contact strip 42' of an inclined plunger 41' is pressed downward when the IC package 90 is forcedly pressed downward for the contact and, depending on the case, has a risk of being bent into a V-shape. In this embodiment, since the inclination is constrained as described above, such bending does not occur. The two upper contact strips 42 and 43 come into contact with the solder ball 92 of the IC package 90 at a predetermined contact pressure as shown in FIG. 8A or 8B. The length L1 of the two upper contact strips 42 and 43 is set so as to prevent the IC package 90 as the contacted object from interfering with the first base member 20.

The two wide portions 44 and 45 which constitute the plunger 41 in this embodiment have upper shoulder portions 44a, 44b and 45a, 45b on the left and right, respectively, and hence the plunger 41 includes the four upper shoulder portions 44a, 44b, 45a, and 45b in total. The wide portions 44 and 45 continue respectively to the corresponding upper contact strips 42 and 43 via the four upper shoulder portions 44a, 44b, 45a, and 45b in a stepped shape. The upper shoulder portions 44a, 44b and 45a, 45b on the left and right of the two wide portions 44 and 45 come into abutment with the shoulder 25b of the first through hole 25 when being assembled as the IC socket 10, and hold the contact 40 in the contact housing space.

The two wide portions 44 and 45 which constitute the plunger 41 in the embodiment have lower shoulder portions 44c, 44d and 45c, 45d on the left and right, respectively, and hence the plunger 41 includes the four lower shoulder portions 44c, 44d, 45c, and 45d in total. The wide portions 44 and 45 continue respectively to the corresponding lower contact strips 47 and 48 via the four lower shoulder portions 44c, 44d, 45c, and 45d in a stepped shape. The lower shoulder portions 44c, 44d and 45c, 45d of the wide portions 44 and 45 on the left and right come into abutment with a supporting portion 52 of the spring portion 53 which constitutes the coil spring unit 51 when being assembled as the IC socket 10. Therefore, the width W2 of the two wide portions 44 and 45 is set to be larger than an inner diameter d5 of the spring portion 53. The plunger 41 is supported by the coil spring unit 51 so as to be movable in the vertical direction in the contact housing space by the lower shoulder portions 44c, 44d and 45c, 45d come into abutment with the supporting portion 52. Therefore, it is preferable to set the width W2 of the two wide portions 44 and 45 to be the same as the outer diameter D5 of the spring portion 53.

The two lower contact strips 47 and 48 which constitute the plunger 41 in this embodiment are arranged in the spring portion 53 which constitutes the coil spring unit 51. The two lower contact strips 47 and 48 which constitute the plunger 41 are allowed to be resiliently deformable in the fore and aft direction (left and right direction in FIG. 2D) at lower portions where contact points 47a and 48a exist, respectively. The respective contact points 47a and 48a of the lower contact strips 47 and 48 come into resilient contact with an inner peripheral surface of the slimly wound portion 55b of the tight wound portion 55 which constitutes the coil spring unit 51 when the entire plunger 41 is pressed downward as shown in FIG. 8A. Accordingly, the plunger 41 forms an electric path (signal circuit) extending between the solder ball 92 of the IC package 90 and an external contact point of the wiring substrate 80 so as to bypass a helical path of the spring portion 53 and electrically short-circuited.

Therefore, the length L3 of the two lower contact strips 47 and 48 which constitute the plunger 41 in this embodiment is set as follows. The length L3 should be set to a length longer than a length obtained by subtracting an amount of displacement S from a length L4 of the spring portion 53 which constitutes the coil spring unit 51, where S is the amount of displacement of the plunger 41 when the IC package 90 is mounted on the IC socket 10 (see FIGS. 8A and 8B). As shown in modifications in FIGS. 11A and 11B, the length L3 of the lower contact strips 47 and 48 may be set so that the lower end portions of the lower contact strips 47 and 48 come positions which overlap with the guiding portion 55a of the tight wound portion 55. By the configuration of the lower contact strips 47 and 48 as shown in FIGS. 11A and 11B, reduction of the vertical length of the contact 40 is achieved, and hence the reduction of the height of the IC socket is achieved. Furthermore, the self-correcting of the position of the contact 40, described later, is achieved further smoothly without entry of the lower portions of the lower contact strips 47 and 48 between the wire of the spring portion 53.

As described above, the plunger 41 is formed by punching the metal sheet via the press work, but is formed by being bent. Therefore, the surfaces where the contact points 47a and 48a are formed are not sheared surfaces formed by pressing but smooth surfaces of the sheet metal by itself as shown in FIG. 10B. Therefore, the inner peripheral surface of the slimly wound portion 55b is not scratched by the vertical movement of the contact points 47a and 48a. In other words, as shown in FIG. 10A, if the plunger is formed only by punching of the sheet metal, contact points 47a' and 48a' are formed on the sheared surfaces formed by pressing. In this case, the rough sheared surfaces including burr or the like slide in the vertical direction along the inner peripheral surface of the slimly wound portion 55b, so that the inner peripheral surface may be damaged. In contrast, the contact points 47a and 48a of the lower contact strips 47 and 48 of the plunger 41 in this embodiment do not have such a problem. In addition, as shown in FIG. 10C, by collapsing the contact points 47a and 48a to form tapered surfaces at corners thereof, the contact points 47a and 48a are allowed to slide smoothly along the inner peripheral surface of the slimly wound portion 55b.

The two lower contact strips 47 and 48 which constitute the plunger 41 in this embodiment are arranged in the spring portion 53, so that the width W4 thereof is set to be smaller than the inner diameter d5 of the spring portion 53 as a matter of course. However, a width W3 (see FIG. 3) of connecting portions 47b and 48b with which the two lower contact strips 47 and 48 are connected to the wide portions 44 and 45 is preferably set to the same width as the inner diameter d5 of the spring portion 53 or slightly smaller than that. Furthermore, recesses to allow fitting of the supporting portion 52 of the spring portion 53 are preferably formed in the front and rear (left and right in FIG. 2B) of upper ends of the connecting portions 47b and 48b. In this configuration, the stable support of the plunger 41 is achieved by the supporting portion 52 of the spring portion 53, and the plunger 41 does not slip out of the coil spring unit 51 when being assembled as the contact 40.

Figure 4C:
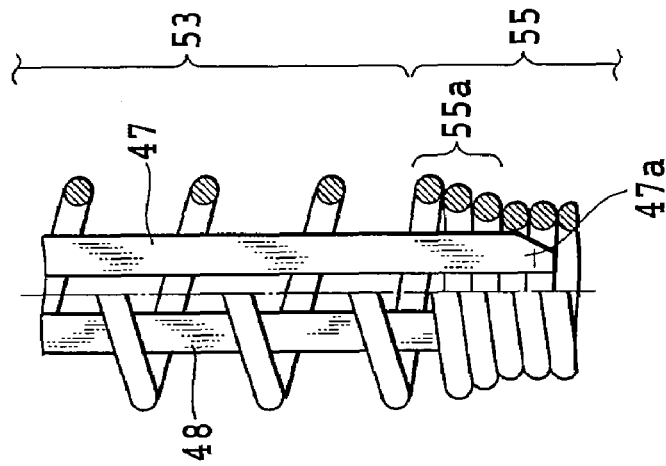
FIG. 4C is a drawing for explaining that the contact is able to correct its position by itself, and is a partially enlarged view of a portion which is equivalent to FIG. 4A showing that the contact has rectified its position and has pressed correctly downward.
Figure 4B:
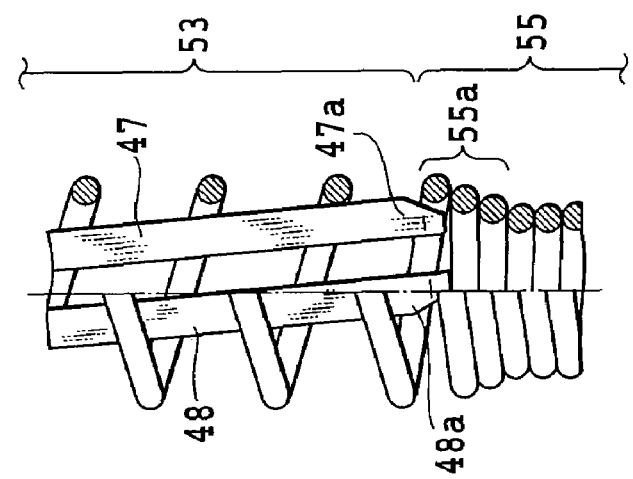
FIG. 4B is a drawing for explaining that the contact is able to correct its position by itself, and is a partially enlarged view of a portion which is equivalent to FIG. 4A showing that the contact is in the course of being pressed downward.
Figure 4A:
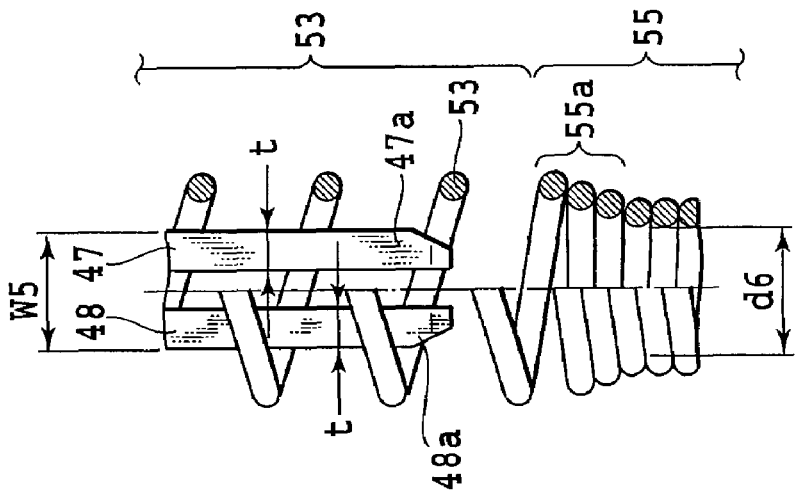
FIG. 4A is a drawing for explaining that the contact is able to correct its position by itself, and is a partially enlarged view of a portion surrounded by a dot line IV in FIG. 2D showing that the contact is in a free state.

The two lower contact strips 47 and 48 are preferably formed into a tapered shape in such a manner that the lower end portions in the vicinity of the respective contact points 47a and 48a are reduced in thickness as it goes downward as shown in FIG. 4 in detail. With the two lower contact strips 47 and 48 configured in this manner, granting that the plunger 41 is inclined as shown in FIG. 4B, the lower end portions of the lower contact strips 47 and 48 are rarely caught by the spring portion 53 or the tight wound portion 55. When the plunger 41 is pressed further downward, the tapered surfaces of the lower end portions of the lower contact strips 47 and 48 are guided into the inclined guiding portion 55a of the tight wound portion 55, whereby the position of the plunger 41 by itself is corrected.

Subsequently, the coil spring unit 51 which constitutes the contact 40 is formed, for example, of stainless or a music wire and, broadly speaking, includes the spring portion 53 and the tight wound portion 55.

The spring portion 53 which constitutes the coil spring unit 51 supports the plunger 41 so as to be movable in the vertical direction by the supporting portion 52 formed on an upper end thereof. In order to stably support the plunger 41, the supporting portion 52 of the spring portion 53 is preferably, but not limited thereto, formed in a tight manner by about two turns as shown in FIGS. 2B and 2D. The spring portion 53 is expandable and contractible as a compressed coil spring and is compressed in the contact housing space, urges the plunger 41 upward, and urges the tight wound portion 55 downward when being assembled as the IC socket 10 as shown in FIG. 5. In this embodiment, the length L4 of the spring portion 53 (the length in the free state in which a load is not applied) is set to be longer than the length L3 of the two lower contact strips 47 and 48 which constitute the plunger 41. However, the length L4 of the spring portion 53 may be substantially the same length L3 of the lower contact strips 47 and 48 of the plunger 41, for example, as in a modification of this embodiment shown in FIGS. 11A and 11B as described above.

The tight wound portion 55 which constitutes the coil spring unit 51 is formed continuously from the spring portion 53, is formed by winding the coil tightly in the helical state, and hence does not function as a spring. The tight wound portion 55 is formed substantially into a funnel shape, and includes the conical-shaped guiding portion 55a and the cylindrical shaped slimly wound portion 55b.

The guiding portion 55a is a portion reduced in diameter in the conical shape from the diameter D5 of the spring portion 53 to the diameter D6 of the slimly wound portion 55b. As described above, the guiding portion 55a comes into abutment with the shoulder portion 35b of the second through hole 35 to hold the coil spring unit 51 in the contact housing space and prevent the coil spring unit 51 from coming off from the space. The guiding portion 55a has a function to correct the position of the plunger 41 when the plunger 41 is pressed downward and the plunger 41 is inclined in association with the pressing action.

The slimly wound portion 55b is placed in the small-diameter portion 35c of the second through hole 35 of the second base member 30 and the lower end portion thereof is electrically connected to the external contact point of the wiring substrate 80 as a contact point 55*c*. Preferably, a distal portion which constitutes the contact point 55*c* of the slimly wound portion 55*b* is curled slightly up as shown in FIGS. 2B and 2D. In this configuration, even when the distal portion of the slimly wound portion 55*b* comes into contact with the external contact point of the wiring substrate 80, a distal cut surface of the slimly wound portion 55*b* does not give damage to the external contact point.

The length L5 of the tight wound portion 55 is set to be longer than the length L10 of the small-diameter portion 35*c* of the second through hole 35. The outer diameter D6 of the slimly wound portion 55*b* of the tight wound portion 55 is set to be slightly smaller than the diameter D4 of the small-diameter portion 35*c* of the second through hole 35, and an inner diameter d6 of the slimly wound portion 55*b* is set to be slightly smaller than the distance W5 between the first and second portions of the plunger 41.

In the state of being assembled as the IC socket 10 shown in FIG. 5, the first through hole 25 and the second through hole 35 define a continuous single through hole penetrated from the bottom surface 21*c* of the placing recess 21 of the first base member 20 to the lower surface 30*b* of the second base member 30. Then, the single through hole functions as the contact housing space for housing the contact 40. The contact 40 is arranged in the through hole in a state wherein the spring portion 53 of the coil spring unit 51 is slightly compressed as shown in FIG. 6A and FIG. 6B in detail. Therefore, a length adding the length of the large-diameter portion 25*c* of the first through hole 25 and the length of the large-diameter portion 35*a* of the second through hole 35 is set to be shorter than a length adding the length of the wide portions 44 or 45 of the plunger 41 of the contact 40, the length of the spring portion 53 and a length L15 from the spring portion 53 to a portion of the guiding portion 55*a* which comes into abutment with the shoulder portion 35*b* of the second through hole 35. That is, the lengths are set to satisfy the relation L7+L8=L6<L2+L4+L15.

An assembly of the IC socket 10 according to the first embodiment having the configuration as described above and an operation to electrically connect the IC package 90 to the wiring substrate 80 will be described below in brief.

In the assembly of the IC socket 10, the contact 40 is assembled firstly as shown in FIG. 1 by inserting the two lower contact strips 47 and 48 of the plunger 41 into the spring portion 53 from the supporting portion 52 of the coil spring unit 51.

Subsequently, in a state in which the first base member 20 is inverted upside down from the state shown in FIG. 5, the two upper contact strips 42 and 43 of the plunger 41 are directed downward, and then the contact 40 is inserted into the first through hole 25. At this time, the two upper contact strips 42 and 43 are inserted in the small-diameter portion 25*a* of the first through hole 25 of the first base member 20. Subsequently, in a state in which the second base member 30 is inverted upside down from the state shown in FIG. 5, the first base member 20 is placed in the housing recess 31 of the second base member 30. At this time, the slimly wound portion 55*b* of the coil spring unit 51 is inserted into the small-diameter portion 35*c* of the second base member 30. Then, by fixing the first base member 20 and the second base member 30 using the fixing member such as a bolt, the IC socket 10 is assembled as shown in FIG. 5 or FIGS. 6A and 6B.

As shown in FIG. 6B, the contact 40 is placed in the contact housing space except for a part of it in a state wherein the spring portion 53 which constitutes the coil spring unit 51 is slightly compressed. More specifically, the two upper contact strips 42 and 43 which constitute the plunger 41 are placed in the small-diameter portion 25*a* of the first through hole 25 provided in the first base member 20 so as to be movable in the vertical direction. However, the upper portion including the four contact points 42*a*, 42*b* and 43*a*, 43*b* of the two upper contact strips 42 and 43 projects upward from the small-diameter portion 25*a*. The slimly wound portion 55*b* of the tight wound portion 55 which constitutes the coil spring unit 51 is placed in the small-diameter portion 35*c* of the second through hole 35 provided in the second base member 30 so as to be movable in the vertical direction. However, the lower portion including the contact point 55*c* of the slimly wound portion 55*b* projects downward from the small-diameter portion 35*c*. The four upper shoulder portions 44*a*, 44*b* and 45*a*, 45*b* of the two wide portions 44 and 45 of the plunger 41 are in abutment with the shoulder portion 25*b* of the first through hole 25 and the guiding portion 55*a* of the coil spring unit 51 is in abutment with the shoulder portion 35*b* of the second through hole 35. Accordingly, the contact 40 is held in the contact housing space defined by the first through hole 25 of the first base member 20 and the second through hole 35 of the second base member 30.

Figure 7A:
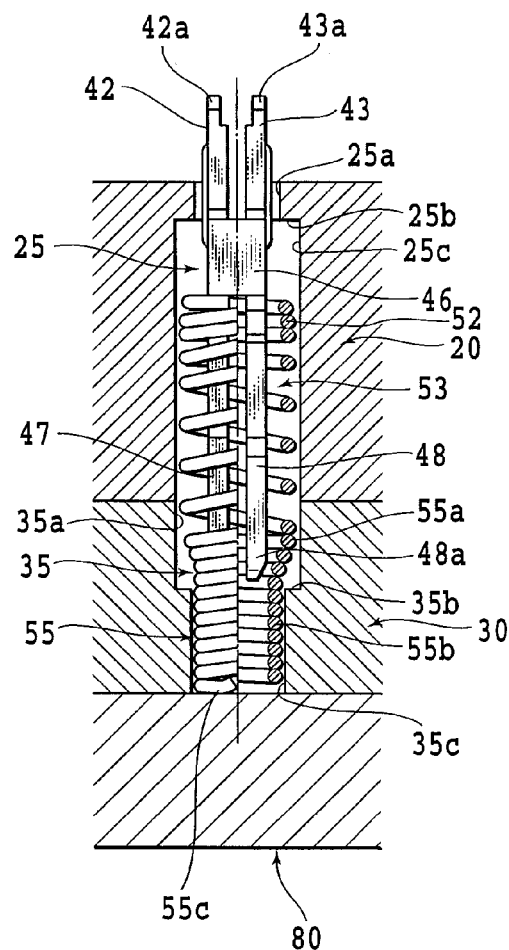
FIG. 7A is a partially enlarged cross-sectional view of the IC socket in a state in which the IC socket is mounted on a wiring substrate equivalent to FIG. 6A.
Figure 7B:
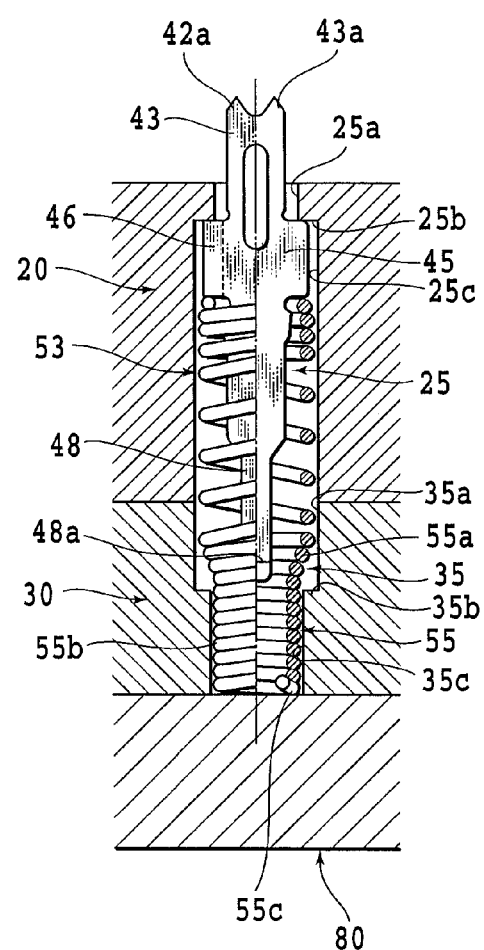
FIG. 7B is a partially enlarged cross-sectional view of the IC socket in the state in which the IC socket is mounted on the wiring substrate equivalent to FIG. 6B.

FIGS. 7A and 7B show a state in which the IC socket 10 is attached on the wiring substrate 80 such as a test board. In this state, the contact point 55*c* of the slimly wound portion 55*b* of the coil spring unit 51 which constitutes the contact 40 comes into contact with the external contact point (not shown) of the wiring substrate 80, and is pushed upward by the wiring substrate 80, so that the spring portion 53 is further compressed slightly.

FIGS. 8A and 8B show a state wherein the IC package 90 is mounted on the placing recess 21 of the IC socket 10 attached on the wiring substrate 80 as shown in FIGS. 7A and 7B. In this state, the IC package 90 guided on the contact 40 is pushed downward by the predetermined amount S toward the contact 40 by a pressing member, not shown, from above. The four contact points 42*a*, 42*b* and 43*a*, 43*b* of the two upper contact strips 42 and 43 of the plunger 41 which constitutes the contact 40 come into contact with the lower portion of the solder ball 92 as the external contact point of the IC package 90 at four points so as to surround the same. The plunger 41 which constitutes the contact 40 is displaced downward by the distance S which corresponds to the amount of downward pushing of the IC package 90, and compresses the spring portion 53 of the coil spring unit 51 which constitutes the contact 40. By the compression of the spring portion 53 of the coil spring unit 51, the contact pressure between the four contact points 42*a*, 42*b* and 43*a*, 43*b* and the solder ball 92 and the contact pressure between the contact point 55*c* and the external contact point of the wiring substrate 80 are determined by a restoring force of the spring portion 53. As shown in FIG. 8A, the contact points 47*a* and 48*a* of the lower contact strips 47 and 48 which constitute the plunger 41 come into resilient contact with the inner peripheral surface of the slimly wound portion 55*b* of the coil spring unit 51, so that the short electric path (signal circuit) is defined. Accordingly, a high-speed signal transmission between the wiring substrate 80 and the IC package 90 is achieved.

Other Embodiments

In FIGS. 12A to 14D, contacts according to second to fourth embodiments are shown respectively. These contacts have are substantially different only in the configuration of the plungers in comparison with the contact 40 according to the first embodiment, and the coil spring units have the same configuration. The structures of the IC sockets to which these contacts are attached are also the same.

The respective embodiments will be described below. FIGS. 12A, 12B, 12C, and 12D show a contact according to a second embodiment of the invention, and are a top view, a front view, a bottom view, and a side view, respectively. FIGS. 13A, 13B, 13C, and 13D show a contact according to a third embodiment, and are a top view, a front view, a bottom view, and a side view, respectively. FIGS. 14A, 14B, 14C and 14D show a contact according to a fourth embodiment, and are a top view, a front view, a bottom view, and a side view, respectively.

A contact 140 according to the second embodiment shown in FIGS. 12A to 12D comprises a plunger 141 and the coil spring unit 51. As described above, the coil spring unit 51 which constitutes the contact 140 according to the embodiment is the same as in the first embodiment, and hence the description is omitted. The structure of the IC socket to which the contact is attached is also the same, and hence the description is omitted.

The plunger 141 which constitutes the contact 140 in this embodiment, being different from that in the first embodiment, is formed by punching a sheet metal having a thickness of t via the press work, and being bent. The plunger 141 comprises a lower contact strip including an upper contact strip 142, a wide portion 143, and two contact strips 145 and 146.

The upper contact strip 142 which constitutes the plunger 141 is further divided into three contact strips 142a, 142b, and 142c each having a contact point at the upper end portion thereof. The two contact strips 142a and 142c arranged on both sides are bent in a substantially L-shape in the same direction toward the front or rear as shown in FIG. 12D. On the other hand, the contact strip 142b arranged at the center is bent into an L-shape in the opposite direction from the two contact strips 142a and 142c so as to oppose thereto at a distance W14. Therefore, in this embodiment as well, three contact points in total positioned at the upper ends of the respective three contact strips 142a, 142b, and 142c are arranged in a plane so as to be broadened in the front, rear, left, and right as in the first embodiment. In this configuration, in the same manner as in the first embodiment, the three contact points located at the upper ends of the respective three contact strips 142a, 142b, and 142c are allowed to come into contact with the lower portion of the solder ball 92 of the IC package 90 so as to surround the same. The inclination of the plunger 141 can be restrained by setting a width W11, a length L11, and the distance W14 to sufficiently large value so as to allow lower portions of the three contact strips 142a, 142b, and 142c to be placed in the small-diameter portion 25a of the first through hole 25.

The wide portion 143 which constitutes the plunger 141 includes, roughly speaking, upper shoulder portions 143a and 143b and lower shoulder portions 143c and 143d as in the first embodiment. The upper shoulder portions 143a and 143b of the wide portion 143 come into abutment with the shoulder portion 25b of the first through hole 25, and the lower shoulder portions 143c and 143d come into abutment with the supporting portion 52 formed on an upper end portion of the coil spring unit 51. A width W12 of the wide portion 143 in this embodiment is set to a value slightly smaller than the diameter of the large-diameter portion 25c of the first through hole 25 and to almost the same as the outer diameter D5 of the coil spring unit 51, as in the first embodiment.

Figure 12A:
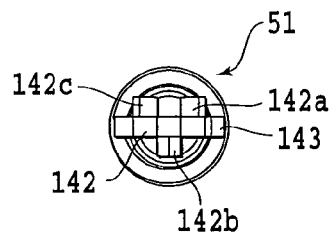
FIG. 12A is a top view of a contact according to a second embodiment of the invention.
Figure 12C:
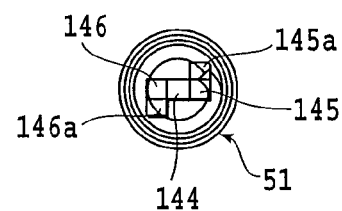
FIG. 12C is a bottom view of the contact according to the second embodiment of the invention.
Figure 12B:
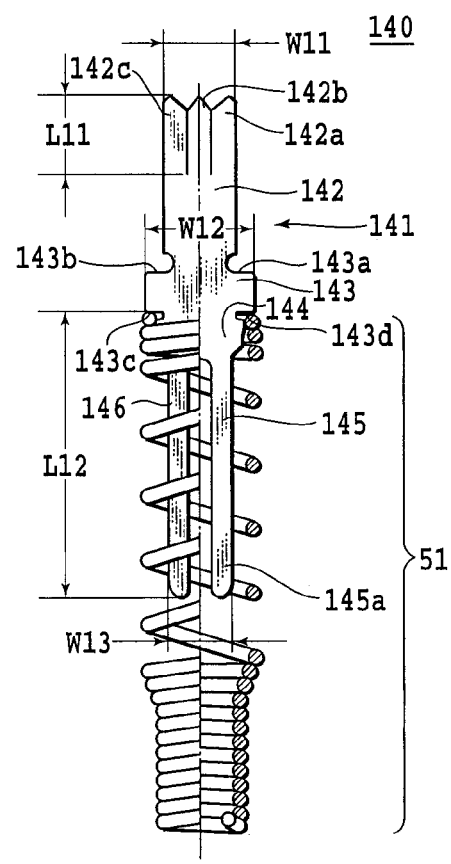
FIG. 12B is a front view of the contact according to the second embodiment of the invention.
Figure 12D:
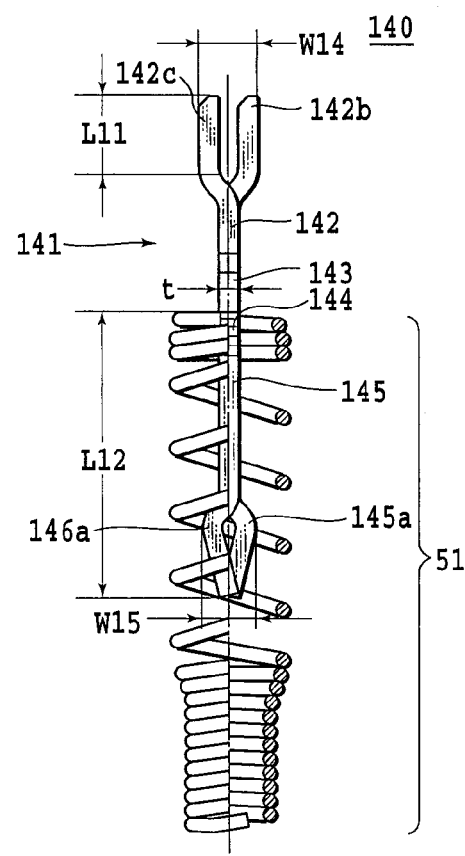
FIG. 12D is a side view of the contact according to the second embodiment of the invention.
Figure 13A:
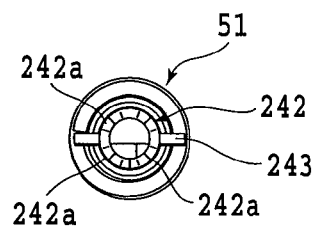
FIG. 13A is a top view of a contact according to a third embodiment of the invention.
Figure 13C:
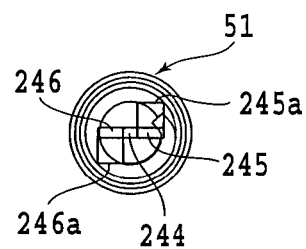
FIG. 13C is a bottom view of the contact according to the third embodiment of the invention.
Figure 13B:
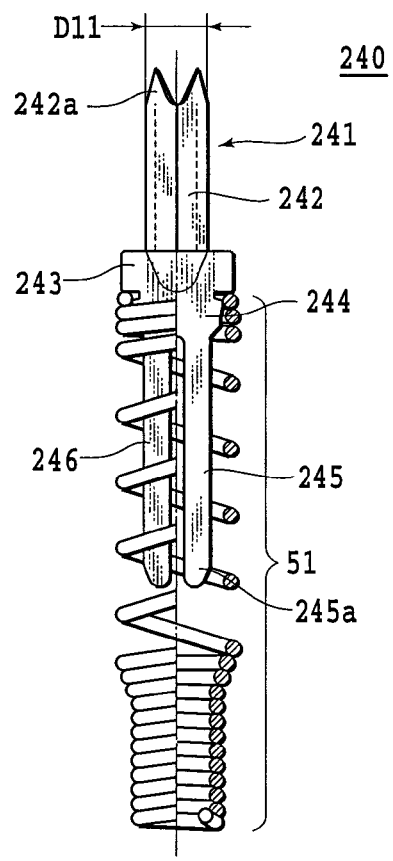
FIG. 13B is a front view of the contact according to the third embodiment of the invention.
Figure 13D:
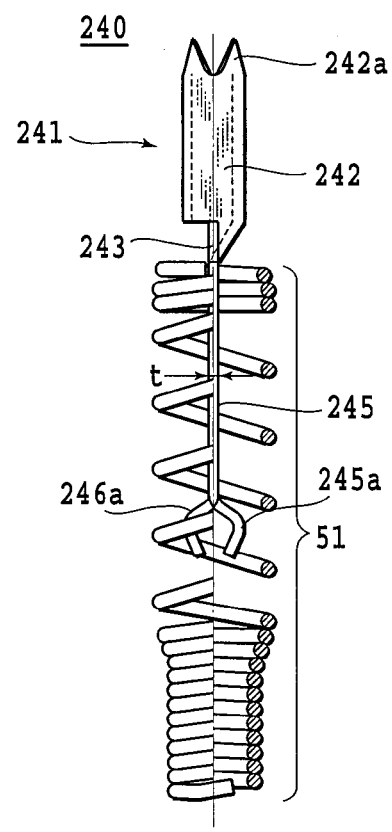
FIG. 13D is a side view of the contact according to the third embodiment of the invention.
Figure 14A:
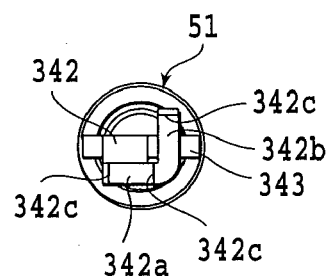
FIG. 14A is a top view of a contact according to a fourth embodiment of the invention.
Figure 14C:
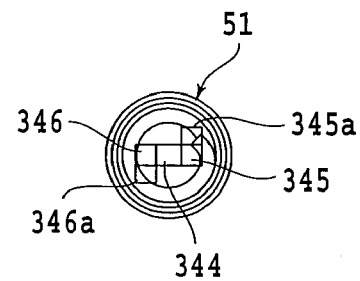
FIG. 14C is a bottom view of the contact according to the fourth embodiment of the invention.
Figure 14B:
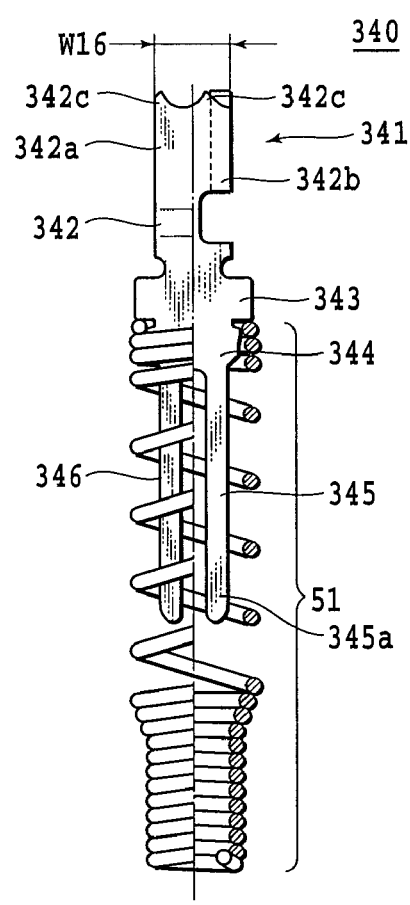
FIG. 14B is a front view of the contact according to the fourth embodiment of the invention.
Figure 14D:
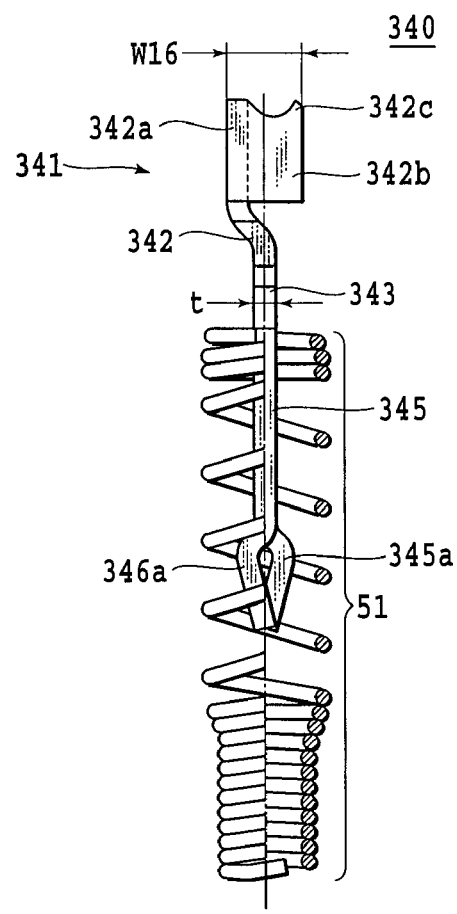
FIG. 14D is a side view of the contact according to the fourth embodiment of the invention.

The lower contact strip which constitutes the plunger 141 includes a connecting portion 144 and the two contact strips 145 and 146 arranged in the widthwise direction (the left and right direction in FIG. 12B). The two contact strips 145 and 146 are formed in parallel to each other, and have arcuate contact points 145a and 146a arranged so as to oppose to each other in the fore-and-aft direction (left and right direction in FIG. 12D), respectively. The two arcuate contact points 145a and 146a are formed so as to be resiliently deformable toward each other. A width W13 of the two contact strips 145 and 146 is set to be smaller than the inner diameter d5 of the spring portion 53 of the coil spring unit 51, and a width W15 between the apexes of the two arcuate contact points 145a and 146a is set to be slightly larger than the inner diameter d6 of the slimly wound portion 55b of the coil spring unit 51. With the configuration of the lower contact strip as described above, portions of the two arcuate contact points 145a and 146a which come into contact with the inner peripheral surface of the slimly wound portion 55b are formed not on the sheared surfaces formed by the punching of the sheet metal, but on the front surface of the sheet metal as in the first embodiment. Therefore, even when the two arcuate contact points 145a and 146a slide on the inner peripheral surface of the slimly wound portion 55b, the inner peripheral surface is prevented from being caught by the arcuate contact points 145a and 146a and hence becoming damaged, so that occurrence of the failure of the electric contact is prevented.

A contact 240 as a third embodiment shown in FIGS. 13A to 13D includes a plunger 241 and the coil spring unit 51. As described above, the coil spring unit 51 which constitutes the contact 240 according to this embodiment is the same as in the first and second embodiments, and hence the description will be omitted. The structure of the IC socket to which the contact is attached is also the same in this embodiment as well, and hence the description is omitted.

The plunger 241 which constitutes the contact 240 in this embodiment, being the same as that in the second embodiment, is formed by punching the sheet metal having a thickness of t via the press work, and being bent. The plunger 241 comprises a lower contact strip including an upper contact strip 242, a wide portion 243, and two contact strips 245 and 246.

The plunger 241 according to this embodiment is different from only in the structure of the upper contact strip 242 in comparison with the plunger 141 according to the second embodiment, and other structures are completely the same as the plunger 141 according to the second embodiment. Here, only the structure of the upper contact strip 242 of the plunger 241 is described, and the description of other parts is omitted.

The upper contact strip 242 which constitutes the plunger 241 in this embodiment is formed by bending a flat sheet metal continuing from the wide portion 243 into a cylindrical shape by a bending work. In this embodiment, four contact points 242a are formed along the circumference of an upper end of the upper contact strip 242 formed into the cylindrical shape. Therefore, in this embodiment as well, the four contact points 242a are arranged in a plane so as to be broadened in the front, rear, left, and right as in the first embodiment. The diameter D11 of the upper contact strip 242 is set to be slightly smaller than the diameter D1 of the small-diameter portion 25a of the first through hole 25. Accordingly, in the same manner as in the first embodiment, the inclination of the plunger 241 is restrained.

A contact 340 as a fourth embodiment shown in FIGS. 14A to 14D includes a plunger 341 and the coil spring unit 51. As described above, since the coil spring unit 51 which constitutes the contact 340 according to this embodiment is the same as those in the first to third embodiments, the description is omitted. The structure of the IC socket to which the contact is mounted is also the same in this embodiment as well, and hence the description is omitted.

The plunger 341 which constitutes the contact 340 in this embodiment, being the same as that in the second and third embodiments, is formed by punching the sheet metal having a thickness of t via the press work, and being bent. The plunger 341 comprises a lower contact strip including an upper contact strip 342, a wide portion 343, and contact strips 345 and 346.

The plunger 341 according to this embodiment is different from only in the structure of the upper contact strip 342 in comparison with the plunger 141 according to the second embodiment, and other structures are completely the same as the plunger 141 according to the second embodiment. Here, only the structure of the upper contact strip 342 of the plunger 341 is described, and the description of other parts is omitted.

The upper contact strip 342 which constitutes the plunger 341 in this embodiment is formed by bending a flat sheet metal continuing from the wide portion 343 into a substantially L-shape when viewed from above by a bending work. In other words, the upper contact strip 342 in this embodiment includes a first strip 342a continuing from the wide portion 343 and extending in parallel thereto, and a second strip 342b bent at a right angle or an acute angle from the first strip 342a so as to extend upward and downward. In addition, in this embodiment, three contact points 342c are formed at an upper end of the upper contact strip 342 formed in the L-shape. In this embodiment, two of them are provided at an upper end of the first strip 342a, and one of them at an upper end of the second strip 342b, although the invention is not limited thereto. Therefore, in this embodiment as well, the three contact points 342c are arranged in a plane so as to be broadened in the front, rear, left and right as in the first embodiment. A width W16 of the first strip 342a and the second strip 342b of the upper contact strip 342 are the same, and are set to be smaller than the diameter D1 of the small-diameter portion 25a of the first through hole 25. Accordingly, in the same manner as in the first embodiment, the inclination of the plunger 341 is restrained. The widths of the first strip 342a and the second strip 342b may not be the same. It must simply be set to a size which restrain the inclination of the plunger 341.

The present invention has been described in detail with respect to preferred embodiments, and it will now be apparent from the foregoing to those skilled in the art that changes and modifications may be made without departing from the invention in its broader aspect, and it is the invention, therefore, in the apparent claims to cover all such changes and modifications as fall within the true sprit of the invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A contact comprising: a plunger formed of a sheet metal and a coil spring unit formed of a metal wire for holding the plunger thereon, wherein the plunger includes at least one upper contact strip having at least three contact points on an upper end portion thereof, a wide portion having a larger width than the width of the upper contact strip, and at least one lower contact strip having two contact strips of a smaller width than that of the wide portion, the two contact strips each having a contact point at a lower end portion thereof, the coil spring unit includes a spring portion which is resiliently deformable so as to be expandable and contractible in the vertical direction and a tight wound portion of a funnel shape having a guiding portion and a slimly wound portion having a contact point at a lower end portion thereof and having an outer diameter and an inner diameter smaller than those of the spring portion, the at least three contact points provided on the at least one upper contact strip are arranged in a plane so as to be broadened at a distance, the two contact points provided on the two contact strips of the at least one lower contact strip are arranged at a distance so as to oppose to each other, are formed so as to be resiliently deformable with respect to each other, and have a distance therebetween to be smaller than the inner diameter of the spring portion and larger than the inner diameter of the slimly wound portion, and the spring portion of the coil spring unit is compressed when the plunger is pushed downward, and the two contact points of the lower contact strip come into resiliently contact with an inner peripheral surface of the slimly wound portion.

2. A contact as claimed in claim 1, wherein the plunger includes two portions each having the upper contact strip, the wide portion, and the lower contact strip having the same size and a connecting portion, and the two portions are bent about the connecting portion as a center so as to extend in parallel to each other and oppose to each other.

3. A contact as claimed in claim 1, wherein the plunger includes the single upper contact strip, the upper contact strip is divided further into three contact strips each having a contact point at an upper end thereof, the contact strips on both sides are bent into an L-shape so as to project in the fore-and-aft direction, the contact strip at the center is bent into an L-shape so as to project in the direction opposite from the contact strips on the both sides so that the contact strip at the center is arranged at a distance so as to oppose to the contact strips on the both sides.

4. A contact as claimed in claim 1, wherein the plunger includes the single upper contact strip and the upper contact strip is formed into a cylindrical shape and is provided with at least three contact points along an upper circumference thereof.

5. A contact as claimed in claim 1, wherein the plunger includes the single upper contact strip and the upper contact strip is bent into an L-shape when viewed from above, and is provided with at least three contact points on an upper end of the L-shaped upper contact strip.

6. A contact as claimed in claim 1, wherein an upper end portion of the spring portion, which constitutes the coil spring unit and holds the plunger thereon, is formed into a tight wound form.

7. A contact as claimed in claim 1, wherein a distal end of a lower end portion of the slimly wound portion which constitutes the coil sprint unit is curled up.

8. An electric connecting apparatus for semiconductor devices configured to electrically connect a semiconductor device as a first contacted object and a second contacted object comprising:

a first base member having a placing recess in which the semiconductor device is placed and a plurality of first through holes;

a second base member having a housing recess for housing the first base member and a plurality of second through holes formed corresponding respectively to the plurality of first through holes; and a plurality of the contacts according to claim 1, the contacts being held in a plurality of contact housing spaces defined by the first through holes and the second through holes in a compressed state, respectively, wherein the first through holes each have a small-diameter portion, a shoulder portion, and a large-diameter portion, the second through holes each have a large-diameter portion, a shoulder portion, and a small-diameter portion, the contacts are held in the contact housing spaces by the abutment of the wide portions of the plungers of the contacts against the shoulder portions of the first through holes and the abutment of the guiding portions of the coil spring units of the contacts against the shoulder portions of the second through holes; and the contact points provided on the upper contact strips of the plungers of the contacts come into contact with external contact points of the first contacted object, and the contact points provided on the slimly wound portions of the coil spring units of the contacts come into contact with external contact points of the second contacted object.

* * * * *